(12) United States Patent
LaFond et al.

(10) Patent No.: US 7,238,999 B2
(45) Date of Patent: Jul. 3, 2007

(54) HIGH PERFORMANCE MEMS PACKAGING ARCHITECTURE

(75) Inventors: Peter H. LaFond, Redmond, WA (US); Lianzhong Yu, Redmond, WA (US)

(73) Assignee: Honeywell International Inc., Morristown, NJ (US)

( * ) Notice: Subject to any disclaimer, the term of this patent is extended or adjusted under 35 U.S.C. 154(b) by 93 days.

(21) Appl. No.: 11/040,208

(22) Filed: Jan. 21, 2005

(65) Prior Publication Data

US 2006/0163679 A1    Jul. 27, 2006

(51) Int. Cl.
*H01L 29/84* (2006.01)

(52) U.S. Cl. ............................ 257/417; 257/E27.006; 438/5; 73/514.02

(58) Field of Classification Search ............... 257/417, 257/E27.006; 73/514.01, 514.2; 438/52
See application file for complete search history.

(56) References Cited

U.S. PATENT DOCUMENTS

| | | | | |
|---|---|---|---|---|
| 5,352,918 A | * | 10/1994 | Thomas et al. | 257/417 |
| 5,476,819 A | * | 12/1995 | Warren | 438/456 |
| 5,504,032 A | * | 4/1996 | Gessner et al. | 438/52 |
| 6,225,145 B1 | | 5/2001 | Choi et al. | |
| 6,294,400 B1 | * | 9/2001 | Stewart et al. | 438/52 |
| 6,308,569 B1 | | 10/2001 | Stewart | |
| 6,536,281 B2 | * | 3/2003 | Abe et al. | 73/504.16 |
| 2003/0166310 A1 | * | 9/2003 | Caplet | 438/50 |

* cited by examiner

*Primary Examiner*—Howard Weiss
*Assistant Examiner*—John Ingham
(74) *Attorney, Agent, or Firm*—Black Lowe & Graham PLLC

(57) ABSTRACT

An apparatus and method for sensor architecture based on bulk machining of Silicon-On-Oxide wafers and fusion bonding that provides a symmetric, nearly all-silicon, hermetically sealed MEMS device having a sensor mechanism formed in an active semiconductor layer, and opposing silicon cover plates each having active layers bonded to opposite faces of the sensor mechanism. The mechanism is structured with sensor mechanical features structurally supported by at least one mechanism anchor. The active layers of the cover plates each include interior features structured to cooperate with the sensor mechanical features and an anchor structured to cooperate with the mechanism anchor. A handle layer of each cover plate includes a pit extending there through in alignment with the cover plate anchor. An unbroken rim of dielectric material forms a seal between the cover plate anchor and the pit and exposes an external surface of the cover plate anchor.

12 Claims, 15 Drawing Sheets

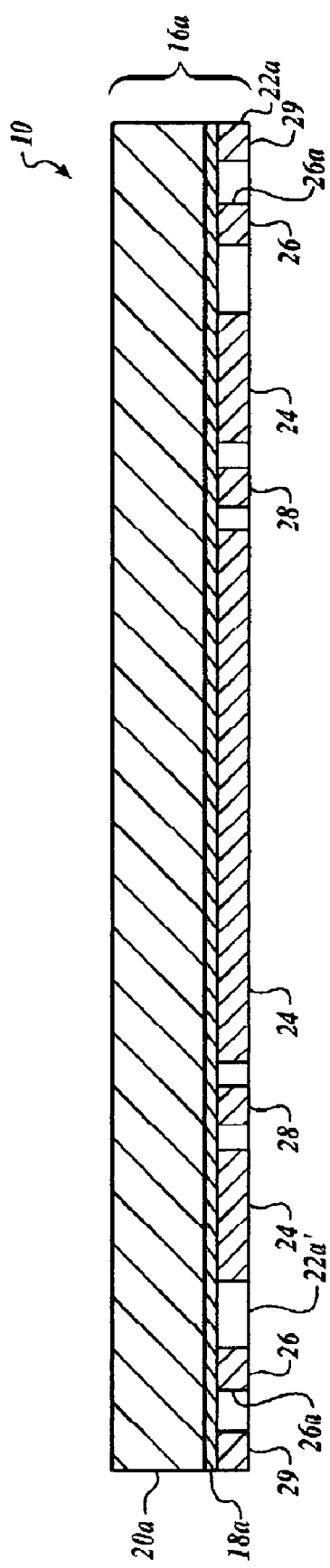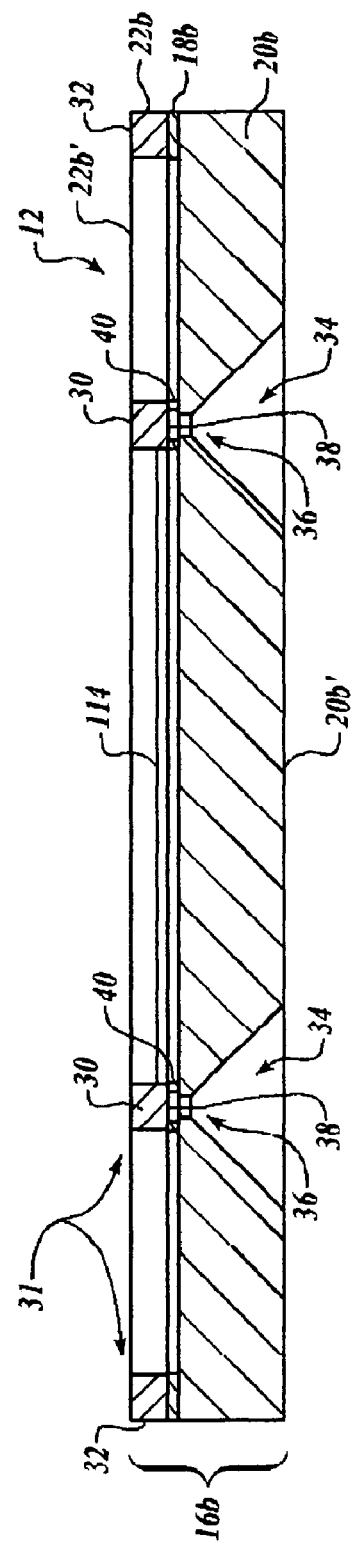

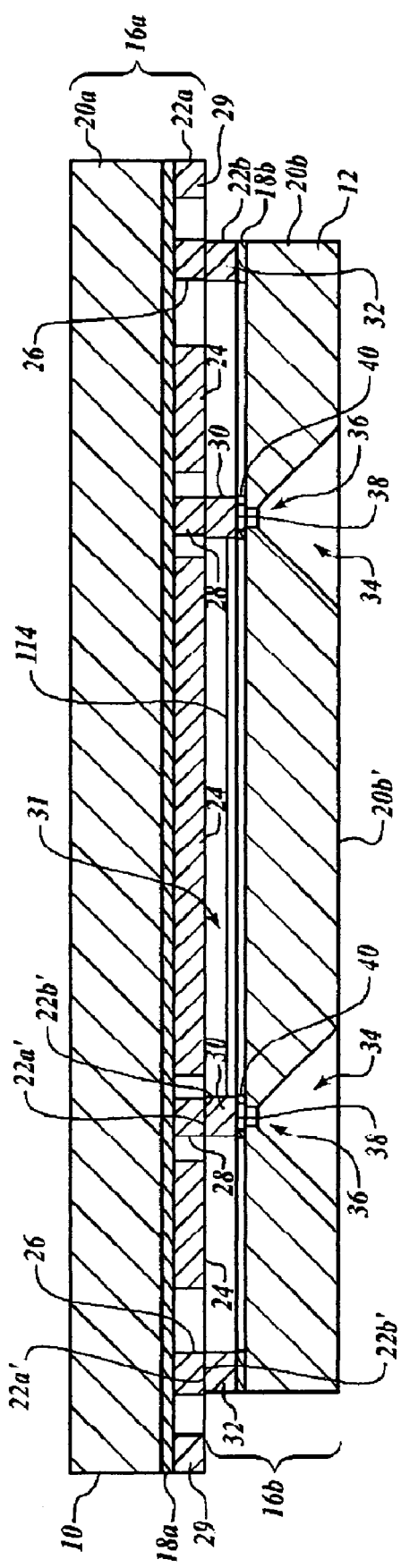
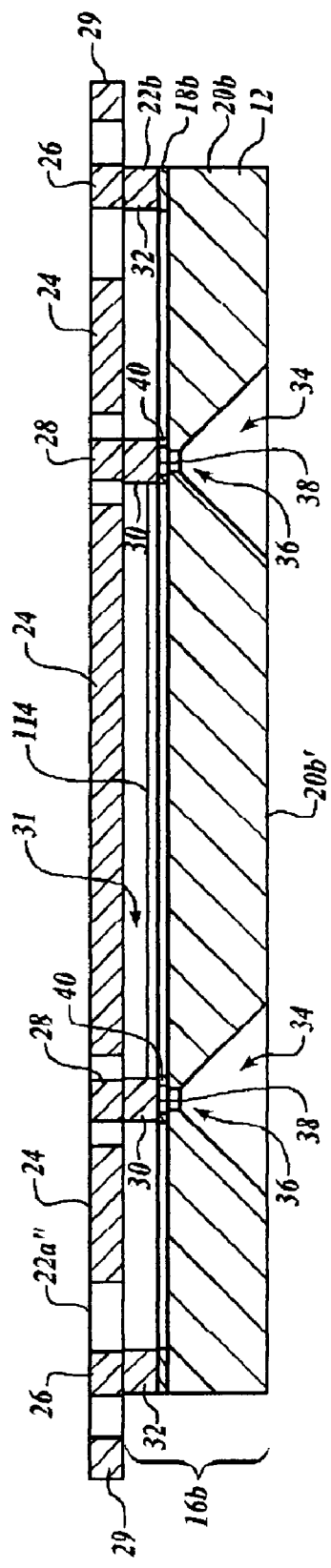
FIG. 3
FIG. 4

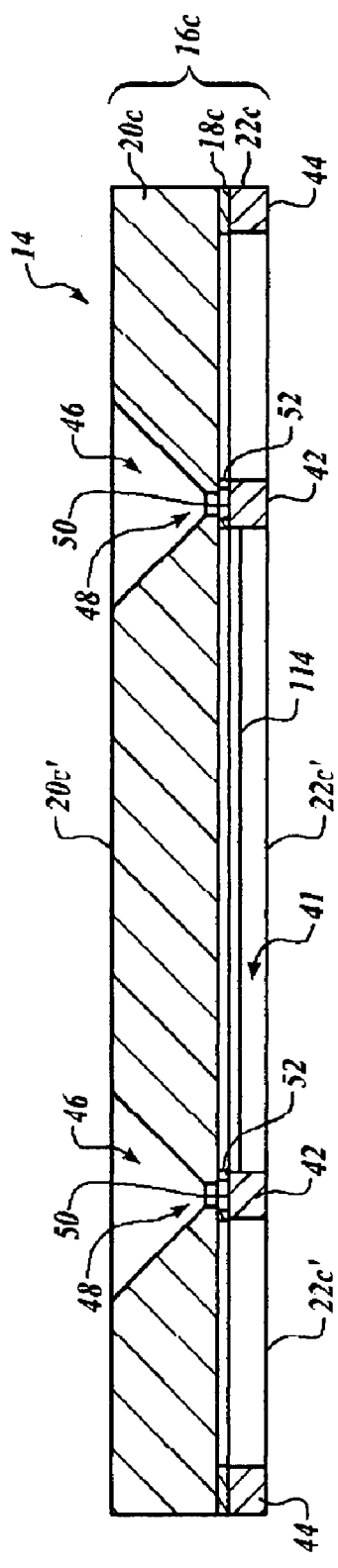
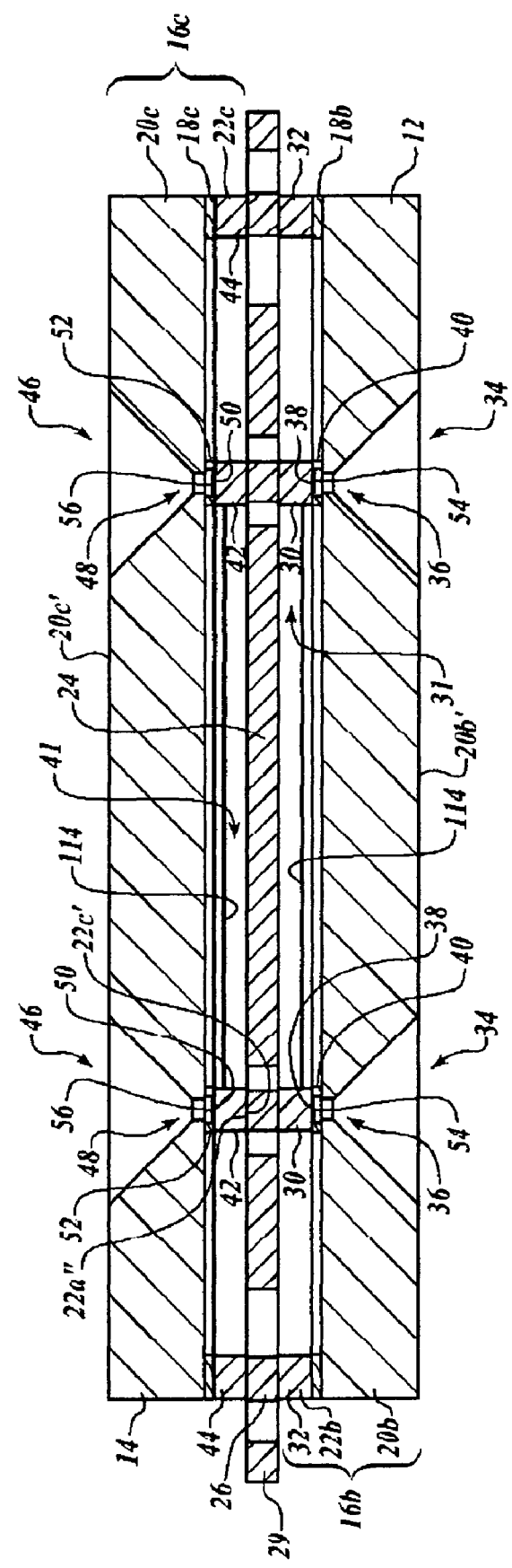

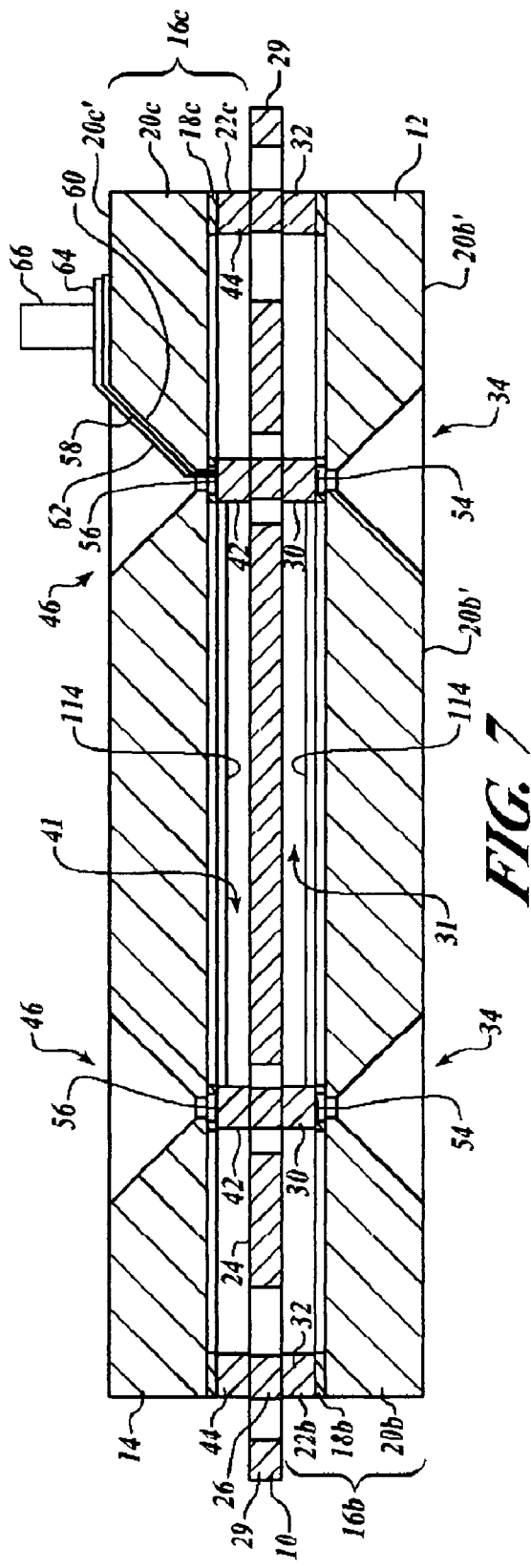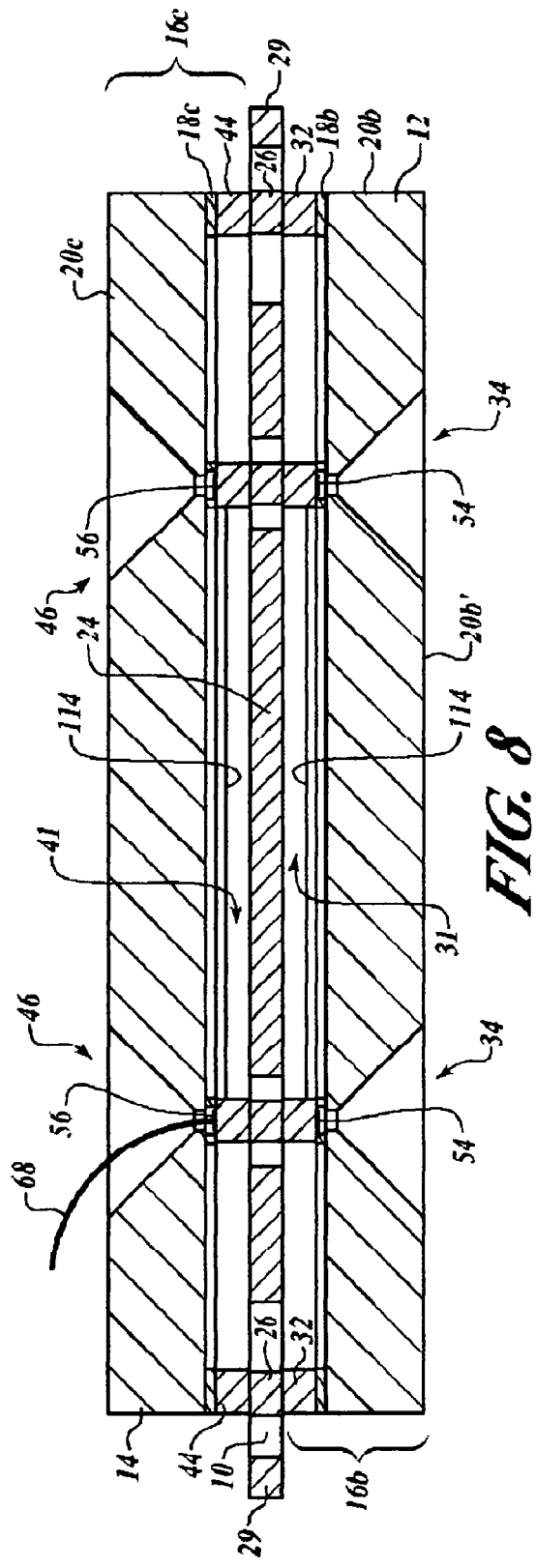

HIGH PERFORMANCE MEMS PACKAGING ARCHITECTURE

FIELD OF THE INVENTION

The present invention relates to micro-machined sensor devices and methods, and in particular to micro-machined accelerometers using a Silicon-On-Insulator (SOI) architecture.

BACKGROUND OF THE INVENTION

Microelectromechanical system or "MEMS" devices are generally well-know. In the most general form, MEMS consist of mechanical microstructures, microsensors, microactuators and electronics integrated in the same environment, i.e., on a silicon chip. MEMS is an enabling technology in the field of solid-state transducers, i.e., sensors and actuators. The microfabrication technology enables fabrication of large arrays of devices, which individually perform simple tasks but in combination can accomplish complicated functions. Current applications include accelerometers, pressure, chemical and flow sensors, micro-optics, optical scanners, and fluid pumps. For example, one micromachining technique involves masking a body of silicon in a desired pattern, and then deep etching the silicon to remove unmasked portions thereof The resulting three-dimensional silicon structure functions as a miniature mechanical force sensing device, such as an accelerometer that includes a proof mass suspended by a flexure.

The current state of the art of MEMS accelerometer devices is illustrated, for example, by U.S. Pat. No. 6,294,400 and U.S. Pat. No. 6,308,569. As is generally well-known, current MEMS accelerometer devices rely on architectures which compromise "best practice" design principles in order to obtain a structure that can be fabricated within the design rules of a given architecture. However, architectures of current MEMS accelerometer and other devices limit the level of performance achievable.

Some limitations typical of prior art devices include the mechanical die-stack containing multiple different materials having different coefficients of thermal expansion, some with poor thermal conductivity. Typically, the die-stack that forms the mechanical portion of current state of the art accelerometer devices contains multiple materials. The different materials each have different coefficients of thermal expansion, which results in differential expansion between the different materials over temperature. This differential expansion causes a temperature sensitivity in the accelerometer raw output data which requires temperature compensation be performed, either within the accelerometer or at an upper system level, if high performance is desired in the device. This differential expansion also causes high residual stresses to be present in the different joined materials near the interface. These high residual stresses may appear because the joining process is accomplished at an elevated temperature. Alternatively, the high residual stresses are caused by differential expansion over the device's operating temperature range. In either case, even supposedly "elastic" materials like silicon and silicon-dioxide are visco-elastic at the micro level. Therefore, the residual stress drives dimensional instability which, over time, shows as an instability in the device output. For example, current state of the art of MEMS accelerometer devices illustrated in U.S. Pat. No. 6,294,400 and U.S. Pat. No. 6,308,569 provide an oxide layer that is in direct contact with proof mass anchors or other critical mechanical features. This oxide layer represents an unstable dimensional condition that is free to act directly on the proof mass.

Another limitation typical of prior art devices is that one or more of the multiple different materials in MEMS accelerometer devices have poor thermal conductivity. Borosilicate glass substrates, for example, are often used as the plate to which the proof mass is anchored. Borosilicate glass has very poor thermal conductivity, relative to silicon. Therefore, a relatively large mechanical distortion is generated in the borosilicate glass substrate when subjected to a thermal gradient, as occurs during a transient thermal condition. This relatively large mechanical distortion drives accelerometer errors which cannot be easily compensated due to the time dependency of the transient.

Also, many prior art devices lack symmetry. For example, a proof mass is often anchored to a single substrate plate, without provision of a mirror-image counter plate on the opposite side of the device. When mounted to a chassis at the next assembly level, the nonsymmetrical device is subject to thermal and mechanical forces and moments which produce warping or "dishing" of the mechanism. The resultant warping or dishing of the mechanism drives many accelerometer errors.

Typical state of the art MEMS accelerometer devices are not hermetically sealed at the wafer level. Rather, most MEMS devices are sealed at a higher assembly level, such as in a lead-less chip carrier (LCC). This failure to seal the device at the wafer level permits contamination to present a significant reliability issue, and an additional layer of packaging and assembly is necessary to ensure a contamination-free device.

Typical state of the art MEMS accelerometer devices do not include strain relief between the actuator and/or sensor die-stack and chassis to which it's mounted. Direct rigid joining of the die-stack to the next level of assembly results in distortion of the die-stack due to forces and moments that the chassis imparts to the die-stack.

Another limitation of typical state of the art MEMS accelerometer devices is that the die-stack structure of many MEMS accelerometer devices is not very stiff. The compliant die-stack allows forces and moments imparted by outside sources to cause errors in the accelerometer output data.

Still another limitation of typical state of the art MEMS accelerometer devices is that most current MEMS accelerometer devices devote an area of the die solely for transferring electrical signals into and out of the actuator and/or sensor. Because overall die space is often limited due to either cost or size restraints, allocation of die area solely for transferring electrical signals causes the physical accelerometer proof mass size to be compromised. The resultant smaller proof mass is a direct cause of lowered performance.

Therefore, devices and methods for overcoming these and other limitations of typical state of the art MEMS accelerometer and other devices are desirable.

SUMMARY OF THE INVENTION

The present invention is an apparatus and method for sensor architecture based on bulk machining of Silicon-On-Oxide (SOI) wafers and fusion bond joining that overcomes many limitations of the prior art by providing a symmetric, nearly all-silicon, hermetically sealed, microelectromechanical system (MEMS) device, such as an electrostatic accelerometer or rate gyro device. The architecture of the present invention includes a device sensor mechanism formed in an active semiconductor layer, and a pair of silicon cover plates each having a relatively thicker handle portion and a relatively thinner active portion separated by a thin layer of oxide, the active layers of the cover plates being bonded to opposite faces of the device sensor mechanism.

The present invention thus provides a simple, novel high-performance MEMS accelerometer or rate gyro fabricated by an SOI bulk-machining process. Accelerometers measure linear acceleration along a defined axis, while rate-gyros measure the rate of rotation around a given axis. Both devices are used to monitor motion; three of each type of device, oriented properly with respect to one another, can suffice to completely measure the motion of an object as it moves through space.

The MEMS accelerometers, rate gyros and other MEMS devices of the invention are provided in three-layer die-stack fabricated entirely from SOI wafers. The three parts are a mechanism die and two cover plates that sandwich the mechanism. According to different embodiments, the MEMS device of the invention is provided as different two types of electrostatic accelerometers, and IPA (in-plane accelerometer) where the axis of detected acceleration is in the plane of the mechanism layer, and an OPA (out-of-plane accelerometer) where the sensed axis is perpendicular to the mechanism layer. All of these devices are designed to run as either open-loop or closed-loop instruments. The choice of open-loop versus closed-loop has many implications for total instrument cost and performance, but the advantages described in this invention apply to both types. For example, two highly similar IPAs packaged as described in this invention, one open-loop and the other closed-loop, differ only in the number of input/output signals and the quantity of a particular structure feature. But the general device architecture is the same.

The mechanism layer of a MEMS device according to the invention contains a moveable proof mass with flexures, and fixed structures, such as fixed comb teeth in an electrostatic in-plane accelerometer (IPA), for example. At the outer edges of the mechanism die, an optional mounting flange with integral mechanical directional isolation features provides means for joining the die stack to the next assembly level, such as an LCC or a circuit board.

The two cover plates that sandwich the mechanism are substantially identical and provide a number of functions. The two cover plates join to the mechanism to form a sealed mechanism cavity. The two cover plates provide a means to isolate different operational electrical signals. For example, two or more different operational signals are used in a typical MEMS device, with the exact number of operational signals being a function of the device design. The cover plates structurally support the proof mass at one or more anchor points, and also support cooperating interior cover plate features, such as fixed comb teeth in an IPA device. In an OPA device, the cooperating interior cover plate features of the cover plates include sense regions and, if used in a closed loop design, drive regions.

Ideally, according to "best practices" a MEMS accelerometer or other device is fabricated entirely from pure bulk material. For practical reasons, this is not possible. For example, electrical isolation between different portions of the sensor device is necessary for functionality. However, the present invention holds to the exclusive silicon concept as closely as possible and utilizes dielectric material to create the isolation is a way that minimizes its effect on performance. The present invention enables several MEMS device "best practices," including forming the die stack almost entirely of silicon and utilizing fused bonded construction. The non-silicon material is limited to a very thin, about 2 micron, $SiO_2$ layer in each cover plate which provides electrical isolation and also operates as an etch-stop during fabrication. The $SiO_2$ is removed from direct contact with the device sensor mechanism by the active layer of the two cover plates. The $SiO_2$ is thus surrounded above and below by thick, stiff silicon so that any effect the $SiO_2$ might otherwise have on the stability of the MEMS device is mitigated. In contrast, prior art devices place the $SiO_2$ layer directly adjacent to the device sensor mechanism.

Additionally, a material that is strong, stiff, with low coefficient-of-expansion and high thermal conductivity, is ideal for many MEMS devices, including an accelerometer. Silicon, the material utilized in the present invention, satisfies these goals and can be bulk micro-machined using standard IC foundry processes.

The architecture of the die stack of the invention is limited to pure silicon, exclusive of the $SiO_2$ isolator layers, which causes the die stack of the invention to be structurally very stiff, which in turn reduces effects of forces applied to the outside of the die-stack via the mounting flange.

The directional mounting flange and isolator between the die-stack and the user's mounting surface insulates the accelerometer proof mass from outside forces. Radial stress applied to the die-stack due to differential expansion between the silicon and the chassis material is a source of errors in MEMS devices, including MEMS accelerometer devices. Tines within the isolator portion of the directional mounting flange of the invention are compliant to radial expansion, but are stiff against in-plane and out-of-plane translation and rotation of the die stack. Radial compliance reduces the magnitude of forces entering the die-stack via the mounting flange. According to one embodiment of the invention, the directional mounting flange is fabricated integrally with the mechanism layer. Alternatively, the directional mounting flange is fabricated as a separate piece that is joined to the die-stack in an assembly step with adhesive, or another bonding method.

Another MEMS device "best practices" is symmetry of the die stack about its mid-plane, which insures maximum utilization of common mode error cancellation. Symmetry causes common mode errors to cancel. A high degree of symmetry is known to greatly reduce temperature sensitivities and improve the long-term stability of bias, scale factor, axis misalignment, vibration rectification, and other errors common in accelerometers.

Another MEMS device "best practices" is hermetically sealing of the MEMS device, which is provided in the present invention by joining the two cover plates to the mechanism to form a sealed mechanism cavity containing the device sensor mechanism.

Another MEMS device "best practices" provided by the invention is forming openings in the cover plate outside handle layer for permitting wire bond access to the device operational electrical input and output signals. Each input and output signal is accessed through either the cover plate at either the top or bottom of the MEMS device. Such through-plate access to the signals permits a variety of mounting and interfacing methods. Optionally, conductive traces are deposited on the walls of the openings and connected to a pad on the top, which permits easier wire bonding or flip-chip assembly. Furthermore, if multiple portions of the device sensor mechanism or cooperating interior cover plate features carry the same signal, these portions are optionally connected internally within one of the cover plates such that multiple wire-bonds, or flip-chip pads, for the same signal are avoided.

The device sensor mechanism is formed in the active semiconductor layer of an SOI, the device sensor mechanism being formed with one or more anchor portions and other fixed sections, as well as a movable proof mass. Optionally, a continuous marginal frame or rim is also formed in the active semiconductor layer surrounding the other portions of the mechanism.

The active layer of each cover plate is etched back in a pattern matched to the device sensor mechanism, with a pad of active semiconductor material provided opposite each of the one or more anchor portions, and a continuous marginal frame or rim of active semiconductor material provided opposite the continuous marginal frame or rim formed in the mechanism layer, if present. The outside handle layer of one or both cover plates is etched with pits in a pattern matched to the pattern of anchor portions formed in the mechanism layer. The pits in the cover plate handle layer extend through the oxide layer to expose the cover plate inside active layer.

The cover plates are joined to both sides of the device sensor mechanism to hermetically enclose a moveable accelerometer proof mass and its associated fixed sense and/or drive electrodes. The oxide layer in each cover plate, located so as to minimize its effect on sensor stability, provides for both electrical isolation between signals and for structural support to the proof mass and fixed electrodes. Electrical connection between supporting electronics and the interior electrodes is via pit features etched in the exterior or "handle" layer of the cover plates. The location of these pit features is generally within the outline of the mechanical features of the device. Both overall die area and trace lengths are thus kept to a minimum.

According to one aspect of the invention, gold or aluminum bond pads are deposited onto the portions of the cover plate active layer exposed through the pits in the cover plate handle layer. Wire bond connections are made to the bond pads to provide access to the signal traces formed on the device sensor mechanism to carry device input or output signals.

According to another aspect of the invention, metal traces are led from the portions of the cover plate active layer exposed through the pits to stud bumps on the cover plate handle layer exterior surface for flip chip assembly. An insulator is deposited on the handle layer silicon in the areas that the metal will be applied to prevent shorting between the different signals.

According to one aspect of the invention, the device sensor mechanism includes both translational and rotational proof masses for measurement in three orthogonal axes. According to another aspect of the invention, two proof masses within the same die-stack provide two-axis measurement. Multiple proof masses within the same die-stack is applicable to either accelerometers or rate-gyros.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 1 is a cross-sectional view that illustrates fabrication of the device sensor mechanism of the invention in a mechanism SOI wafer element;

FIG. 2 is a cross-sectional view that illustrates fabrication of a first silicon cover plate of the invention in a first cover plate SOI wafer element;

FIG. 3 is a cross-sectional view that illustrates transfer of the device sensor mechanism of the invention to the first silicon cover plate of the invention;

FIG. 4 is a cross-sectional view that illustrates the device sensor mechanism of the invention freed from the mechanism SOI handle wafer element;

FIG. 5 is a cross-sectional view that illustrates fabrication of a second silicon cover plate of the invention in a second cover plate SOI wafer element;

FIG. 6 is a cross-sectional view that illustrates the joining of the second silicon cover plate of the invention with the mechanism element of the invention opposite from the first cover plate of the invention;

FIG. 7 is a cross-sectional view that illustrates application of one or more wire bond pads on inside surfaces of the first and second cover plate anchors of the invention exposed at the bottom of the respective pit features of the invention in the first and second cover plates of the invention;

FIG. 8 is a cross-sectional view that illustrates one or more electrically conductive wires wire bonded to one or more of the different wire bond pads illustrated in FIG. 7;

DETAILED DESCRIPTION OF PREFERRED EMBODIMENT

Figure 9:
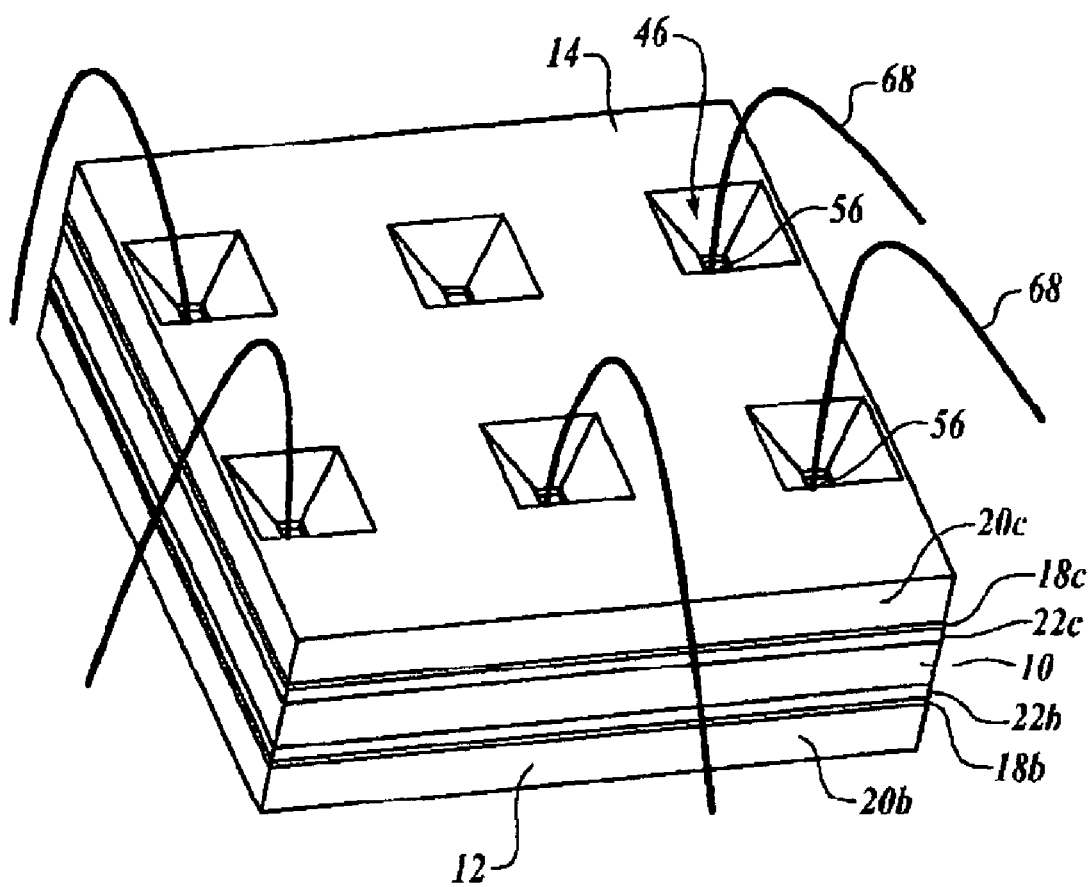
FIG. 9 is a perspective view that shows one side of the assembled fusion bonded and hermetically sealed nearly all-silicon MEMS device of the invention as illustrated in FIG. 8 having the isolator flange removed for clarity.

In the Figures, like numerals indicate like elements.

The Figures illustrate the method of the present invention for fabricating a sensor architecture based on bulk machining of Silicon-On-Oxide (SOI) wafers and fusion bond joining that produces a symmetric, nearly all-silicon, hermetically sealed, microelectromechanical system (MEMS) inertial device 1, such as an electrostatic accelerometer or Coriolis rate gyro device, operated in either open-loop or closed-loop modes.

The architecture of the present invention includes a device sensor mechanism 10 and first and second silicon cover plates 12, 14 bonded to opposite faces of the device sensor mechanism 10. The device sensor mechanism 10 and silicon cover plates 12, 14 are formed in different SOI wafer elements of a type that is generally commercially available. Each wafer element includes a buried dielectric layer having a thickness of from about 0.5 to 2.0 microns that is sandwiched between a relatively thicker "handle" layer and a relatively thinner "active" layer both of semiconductor material. The material of the dielectric layer may be either an oxide, nitride, or other insulator, that is thermally grown on the associated, underlying layer of semiconductor material. The joints between the dielectric layer and each of the handle and active layers are inherently hermetic.

FIG. 1 is a cross-sectional view that illustrates fabrication of the device sensor mechanism 10 in a mechanism SOI wafer element 16a having a dielectric layer 18a between semiconductor handle 20a and active layers 22a. According to conventional MEMS fabrication procedures, the device sensor mechanism 10 is formed in the mechanism SOI wafer element 16a by known dry etching processes, such as either RIE (Reactive Ion Etch) or DRIE (Deep Reactive Ion Etch) processes. Such processes include, for example, the deep trench dry silicon etching processes commercially known as "BOSCH" and "ALCATEL." RIE and DRIE processes both obtain substantially vertical sidewalls of the etched features without concern for the crystallographic orientation of the etched substrate, whereby a more compact MEMS device results, which in turn enables more devices to be fabricated per wafer to produce a significant cost advantage. Thickness of the mechanism active layer 22a is selected as a function of design criteria not discussed here, but the invention has been successfully practiced using mechanism SOI wafer element 16a having both 50 um and 100 um thick mechanism active semiconductor layers 22a. The device sensor mechanism 10 is formed by etching completely through the active layer 22a of the mechanism SOI wafer element 16a. In practicing the invention, appropriate actuator and/or sensor mechanical features 24 and, optionally, a continuous marginal frame or rim 26 are exposed in the active layer 22a of the mechanism SOI wafer element 16a by etching through to the underlying oxide layer 18a. Simultaneously with etching to expose the mechanical features 24, etching exposes a selected quantity of mechanism anchors 28 in an appropriate pattern in the mechanism active layer 22a. The mechanism anchors 28 structurally support the mechanical features 24, but are optionally mechanically isolated from the structurally supported mechanical features 24.

An isolator flange 29 is optionally provided along the peripheral edge surface of the mechanism active layer 22a external of the mechanical features 24. If the marginal frame 26 is present, the isolator flange 29 is coupled to an external peripheral edge surface 26a thereof According to one embodiment of the invention, the isolator flange 29 is optionally formed in the mechanism active layer 22a integrally with the marginal frame 26. Alternatively, the isolator flange 29 is optionally formed separately from the mechanism active layer 22a in the active layer of a separate SOI wafer element by a known dry etching process, such as either RIE or DRIE, followed by floating the parts off the separate SOI wafer handle layer with an appropriate wet etching. Thereafter, the separate isolator flange 29 is joined to the marginal frame 26 of the device sensor mechanism 10 at mid plane. The separate isolator flange 29 is joined to the marginal frame 26 either using an adhesive or another bonding method.

FIG. 2 is a cross-sectional view that illustrates fabrication of the first silicon cover plate 12 in a first cover plate SOI wafer element 16b having a dielectric layer 18b between semiconductor handle and active layers 20b, 22b, wherein the active layer 22b is etched through to the underlying oxide layer 18b to expose a pattern of cooperating interior cover plate features 31. The cooperating interior cover plate features 31 includes one or more cover plate anchors 30 exposed in the active layer 22b distributed in a pattern structured to cooperate with the mechanism anchors 28. The quantity of cover plate anchors 30 is selected to match the quantity of mechanism anchors 28 formed in the mechanism 10, and the cover plate anchors 30 are positioned in a matching pattern to the mechanism anchors 28.

The cooperating interior cover plate features 31 optionally include a continuous marginal frame or rim 32 that is sized and positioned to cooperate with the mechanism marginal frame 26 for hermetically sealing the mechanism 10. For example, the cover plate active layer 22b is optionally simultaneously etched through to the underlying oxide layer 18b to expose the continuous marginal frame 32 in the active layer 22b of the first cover plate SOI wafer element 16b that is the full depth or thickness of the cover plate active layer 22b and is positioned along the periphery of the cover plate 12 to cooperate with the mechanism 10 for bonding to the marginal frame 26 thereof Additionally, a pit 34 is formed in the handle layer 20b of the first cover plate SOI wafer element 16b in alignment with each of the cover plate anchors 30.

The cover plate anchors 30 and marginal rim 32 features in the active layer 22b and the pit features 34 in the handle layer 20b of the cover plate SOI wafer may be formed using either RIE or DRIE processes. However, according to one embodiment of the present invention, at least the pit features 34 are formed as inverse pyramid shapes having sloped, rather than straight, sidewalls. For example, when conventional wet etching solutions such as potassium hydroxide (KOH) are used, the anisotropic nature of the etching process proceeds along the crystallographic planes of the silicon layers and results in sloped sidewalls, in contrast to the straight sidewalls that result from using RIE and DRIE processes. Optionally, the cover plate anchors 30 and marginal rim 32 features are also formed using a conventional wet etching process.

Subsequently, using a conventional etching process appropriate for the purpose, a portion of the cover dielectric layer 18b is etched in the areas exposed by earlier etching of the semiconductor handle and active layers 20b, 22b, so that the dielectric material exposed between the cover plate anchors 30 and marginal rim 32 is removed. The dielectric material exposed by etching of the pit features 34 in the handle layer 20b of semiconductor material is also removed, which exposes a channel 36 between the bottom of each pit feature 34 and an inside surface 38 of the associated cover plate anchor 30.

Each of the pit features 34 is formed with a smaller cross-section than the associated cover plate anchor 30, at least at the bottom of the pit feature 34 adjacent to the dielectric layer 18b, and within the perimeter of the associated cover plate anchor 30. Consequently, the channel 36 exposed in the dielectric layer 18b lies within the borders of the associated cover plate anchor 30. Although conventional etching processes typically result in undercutting of the dielectric layer 18b in the areas masked by the pit features 34 on the handle layer 20b and on cover plate anchors 30 on the active layer 22a, etching of the dielectric layer 18b substantially follows the outline of the masking features. Therefore, the portion of dielectric layer 18b masked between each of the pit features 34 and the associated cover plate anchor 30 remains substantially intact. Alignment of the smaller cross-section pit features 34 within the outline of the larger associated cover plate anchor 30 causes a continuous marginal frame or rim 40 of dielectric material to be retained around each of the smaller cross-section pit features 34 at the perimeter of the associated cover plate anchor 30. The channel 36 at the bottom of each pit feature 34 and the inside surface 38 of the associated cover plate anchor 30 are contained within the resulting marginal rim 40 of dielectric material. The marginal rims 40 of dielectric material are unbroken seals between the handle layer 20b and the inside surface 38 of each of the different cover plate anchors 30. The marginal rims 40 of dielectric material thus provides a hermetic seal between the handle and active layers 20b, 22b of the first cover plate SOI wafer element 16b at each of the pit features 34.

Similarly, the portion of the dielectric layer 18b masked between the handle layer 20b and the marginal rim 32 provides a hermetic seal between the handle and active layers 20b, 22b of the first cover plate SOI wafer element 16b along the perimeter of the cover plate 12 in the area of the marginal rim 32.

FIG. 3 is a cross-sectional view that illustrates transfer of the device sensor mechanism 10 to the first silicon cover plate 12. Accordingly, a first surface 22a' of the active layer 22a of the mechanism SOI wafer element 16a is joined to an exposed surface 22b' of the first cover plate active layer 22b. For example, surfaces 22a' and 22b' of the mechanism and first cover plate active layers 22a, 22b are joined by either fusion bonding or eutectic bonding, both of which produce a hermetic seal at the joints. Optionally, other conventional joining methods, such as glass frit or adhesives, are used. The mechanism anchors 28 formed in the active layer 22a of the mechanism SOI wafer element 16a are fusion or eutectic bonded to the mating cover plate anchors 30 formed in the active layer 22b of a first cover plate SOI wafer element 16b. The bonded mechanism and cover plate anchors 28, 30 structurally support the mechanism mechanical features 24 by direct coupling of the mechanism anchors 28 to the first cover plate 12 through the cover plate anchors 30. The bonded mechanism and cover plate anchors 28, 30 simultaneously provide a continuous electrical signal path between the semiconductor material of the mechanism and cover plate active layers 22a, 22b.

If present, the continuous marginal frame 26 portion of the mechanism active layer 22a is fusion or eutectic bonded to the mating continuous marginal rim 32 of the first cover plate active layer 22b simultaneously with bonding of the mechanism and cover plate anchors 28, 30. The fusion bonded continuous marginal frame 26 and rim 32 result in the device sensor mechanism 10 being hermetically sealed to the first cover plate 12.

FIG. 4 is a cross-sectional view that illustrates the device sensor mechanism 10 freed from the handle and dielectric layers 20a, 18a of the mechanism SOI wafer element 16a. The mechanism handle and dielectric layers 20b, 18b are removed by appropriate conventional etching methods as is well-known in the art. As a result, the device sensor mechanism 10 remains attached to the first cover plate 12 being structurally supported by the mechanism anchors 28 coupled to the cover plate anchors 30. If present, the marginal frame 26 portion of the device sensor mechanism 10 is remains supported by the marginal rim 32 portion of the cover plate 12.

FIG. 5 is a cross-sectional view that illustrates fabrication of the second silicon cover plate 14 in a second cover plate SOI wafer element 16c similarly to fabrication of the first cover plate 12. The second cover plate SOI wafer element 16c includes a dielectric layer 18c between semiconductor handle and active layers 20c, 22c, wherein the active layer 22c is etched through to the underlying oxide layer 18c to expose a pattern of cooperating interior cover plate features 41. The cooperating interior cover plate features 41 includes a quantity of cover plate anchors 42 exposed in the active layer 22c distributed in a matching pattern structured to cooperate with the mechanism anchors 28. Alternatively, the active layer 22c is thoroughly etched so that the cover plate anchors 42 do not remain, but are removed simultaneously with other portions of the active layer 22c.

The cooperating interior cover plate features 41 optionally include a continuous marginal frame or rim 44 in the active layer 22c that is sized and positioned to cooperate with the mechanism marginal frame 26 for hermetically sealing the mechanism 10. For example, the cover plate active layer 22c of the second cover plate SOI wafer element 16c that is the full depth or thickness of the cover plate active layer 22c and is positioned along the periphery of the cover plate 14 to cooperate with the mechanism 10 for bonding to the marginal frame 26 thereof.

Optionally, a pit 46 is etched in the handle layer 20c of the second cover plate SOI wafer element 16c in alignment with each of the second cover plate anchors 42. Each pit feature 46 is formed with a smaller cross-section than the associated cover plate anchor 42, at least at the bottom of the pit feature 46 adjacent to the dielectric layer 18c, and within the perimeter of the associated cover plate anchor 42.

The dielectric material exposed between the second cover plate anchors 42 and marginal rim 44 is removed by etching of the semiconductor handle and active layers 20c, 22c using a conventional etching process appropriate for the purpose. The dielectric material exposed by etching of the pit features 46 in the cover plate handle layer 20c of semiconductor material is also removed, which exposes a channel 48 between the bottom of each pit feature 46 and an inside surface 50 of the associated cover plate anchor 42. Consequently, the channel 48 exposed in the second cover plate dielectric layer 18c lies within the borders of the associated cover plate anchor 42.

The portion of dielectric layer 18c masked between each of the pit features 46 and the associated cover plate anchor 42 remains substantially intact. Alignment of the smaller cross-section pit features 46 within the outline of the larger associated cover plate anchor 42 causes a continuous marginal frame or rim 52 of dielectric material to be retained around each of the smaller cross-section pit features 46 at the perimeter of the associated cover plate anchor 42. The channel 48 at the bottom of each pit feature 46 and the inside surface 50 of the associated cover plate anchor 42 are contained within the resulting marginal rim 52 of dielectric material. The marginal rim 52 of dielectric material is an unbroken seal between the handle layer 20c and the inside surface 50 of each of the different cover plate anchors 42, which provides a hermetic seal between the second cover plate handle and active layers 20c, 22c at each of the pit features 46.

Similarly, the portion of the dielectric layer 18c masked by the handle layer 20c and the marginal rim 44 provides a hermetic seal between the second cover plate handle and active layers 20b, 22b along the perimeter of the second cover plate 14 in the area of the marginal rim 44.

FIG. 6 is a cross-sectional view that illustrates the joining of the second silicon cover plate 14 with the active layer 22a of the mechanism SOI wafer element 16a opposite from the first cover plate 12. Accordingly, a second surface 22a" of the active layer 22a of the mechanism SOI wafer element 16a opposite from the first surface 22a' is joined to an exposed surface 22c' of the second cover plate active layer 22c. For example, surfaces 22a" and 22c' of the mechanism and second cover plate active layers 22a, 22c are joined by either fusion or eutectic bonding to produce a hermetic seal at the joints. The marginal rims 40, 52 of respective dielectric layers 18b and 18c between the first and second cover plate anchors 30, 42 operate in combination with the continuous peripheral marginal cover plate rims 32, 42 to seal the mechanical features 24 of the device sensor mechanism 10 against particulate contamination through the different pit features 34, 46 in the handle layers 20b 20c of the first and second cover plates 12, 14. Therefore, if the continuous peripheral marginal frame 26 of the device sensor mechanism 10 is present along with the mating continuous peripheral marginal rims 32, 52 of the first and second cover plates 12, 14, the mechanical features 24 of the device sensor mechanism 10 are completely sealed against particulate contamination upon contact of the exposed active layer surface 22c' second cover plate 14 with the second surface 22a" of the device mechanism active layer 22a.

The mechanical features 24 of the device sensor mechanism 10 are hermetically sealed upon the assembly reaching fusion temperature. For example, the mechanism and second cover plate active layers 22a, 22c are joined in a hermetic seal by either fusion or eutectic bonding. According to one embodiment of the invention, the mechanism anchors 28 are optionally fusion or eutectic bonded to the mating second cover plate anchors 42. If bonded, the mechanism and cover plate anchors 28, 42 structurally support the mechanism mechanical features 24 by direct coupling of the mechanism anchors 28 to the second cover plate 14 through the cover plate anchors 42. The bonded mechanism and cover plate anchors 28, 42 simultaneously provide a continuous electrical signal path between the semiconductor material of the mechanism and second cover plate active layers 22a, 22c.

If present, the continuous peripheral marginal frame 26 portion of the mechanism active layer 22a is fusion or eutectic bonded to the mating continuous peripheral marginal rim 52 of the second cover plate active layer 22c simultaneously with bonding of the mechanism and cover plate anchors 28, 42. Fusion bonding of the continuous marginal mechanism frame 26 with each of the continuous peripheral marginal cover plate rims 32, 42 result in the device sensor mechanism 10 being hermetically sealed to between the first and second cover plates 12, 14. The marginal rims 40, 52 of dielectric layer 18c surrounding the inside surfaces 36, 50 of the first and second cover plate anchors 30, 42 operate in combination with the continuous peripheral marginal cover plate rims 32, 42 to ensure the mechanical features 24 of the device sensor mechanism 10 are completely hermetically sealed.

FIG. 7 is a cross-sectional view that illustrates application of one or more wire bond pads 54, 56 on the inside surfaces 36, 50 of the first and second cover plate anchors 30, 42 exposed at the bottom of the respective pit features 34, 46 in the first and second cover plates 12, 14. For example, the wire bond pads 54, 56 are gold pads deposited on the anchor surfaces 36, 50 using an appropriate known metal deposition process. The wire bond pads 54, 56 are inherently electrically coupled to the corresponding cover plate anchor 30, 42 by operation of the deposition process. The wire bond pads 54, 56 are electrically isolated from the handle layer 20b, 20c of the first and second cover plates 12, 14 by the electrical interruption provided by the dielectric layers 18b, 18c, which also provide electrical isolation between the anchors 30, 42 and the corresponding handle layer 20b, 20c. The minor undercutting of the of the dielectric layers 18b, 18c in the areas masked by the pit features 34, 46 help to ensure the wire bond pads 54, 56 do not bridge to the adjacent pit features 34, 46. The wire bond pads 54, 56 provide pads for subsequent wire bonding, while the associated pit features 34, 46 provide access to the wire bond pads 54, 56 for the accomplishing the wire bonding process.

Optionally, additional insulator material 58, such as a layer of thermally grown oxide or nitride, is provided on an inside wall surface 60 of the top cover plate pit features 46 over which an electrically conductive trace 62, such as a gold trace, is deposited in electrical contact with the surfaces 50 of the second cover plate anchors 42 with an electrically conductive trace portion 64 extending onto an exterior surface 20c' of the top cover plate handle layer 20c, or an exterior surface 20b' of the bottom cover plate handle layer 20b. A stud bump 66, such as a gold or solder stud bump, of appropriate size is formed on the surface conductive trace portion 64 for combined mechanical and electrical bonding in a conventional flip chip assembly process. The flip chip assembly is sufficiently well-known in the art as to require no further explanation.

FIG. 8 is a cross-sectional view that illustrates one or more electrically conductive wires 68, such as gold wires, mechanically wire bonded to one or more of the different wire bond pads 54, 56. Electrical input and output signals are transmitted into and out of the device sensor mechanism 10 via the wires 68 for operation of the fusion bonded and hermetically sealed nearly all-silicon MEMS device 1. The MEMS device die stack is ready for testing.

FIG. 9 is a perspective view that shows one side of the assembled fusion bonded and hermetically sealed nearly all-silicon MEMS device I illustrated in FIG. 8 (the isolator flange 29 is removed for clarity) having wires 68 mechanically wire bonded to the wire bond pads 54. The mechanically wire bonded wires 68 are used for connecting interior device input and output signals to external electronics. Alternatively, the electrically conductive traces 62 are be run up the inside wall surface 60 of the pit features 34, 46 to the top or bottom exterior surface 20c', 20b' to stud bumps 66 for flip chip assembly, as illustrated in FIG. 8.

The invention is practicable with other MEMS devices having mechanical microstructures, microsensors, microactuators and electronics integrated in the same environment, i.e., on a silicon chip. By example and without limitation, two different MEMS devices are illustrated in the Figures. One is an in-plane accelerometer (IPA) and the other is an out-of-plane accelerometer (OPA). Electrostatic IPA devices are well-known in the art, one example is disclosed in U.S. patent application Ser. No. 10/696,323, entitled "Out-of-Plane Compensation Suspension for an Accelerometer," filed in the name of Mark H. Eskridge on Oct. 23, 2003, which is incorporated herein by reference. The electrostatic IPA employs a mechanical capacitive readout force transducer having a capacitive output proportional to an force applied. Capacitors are formed between comb teeth fixed on an instrument frame and cooperating comb teeth on a translational proof mass suspended by a flexure. A force applied to the proof mass along a particular axis causes translational displacement of the proof mass relative to the frame, which varies the capacitive output of the capacitors. The force applied to the proof mass is quantified by measuring a resultant change in capacitance. Such an electrostatic IPA is a combination of mechanical structure formed of the proof mass, suspension flexure, and fixed instrument framework, and an electrical structure comprising capacitor electrodes, current-feed connections, and external circuitry forming a capacitor circuit. In an electrostatic IPA of the invention, the input axis of the translational proof mass and all the sense and drive comb tooth sections are contained within the device mechanism layer 10 at the center of the device die-stack sandwich 1. The two cover plates 12, 14 capture and support the device mechanism layer 10.

Electrostatic OPA devices are well-known in the art, one example of which is disclosed in allowed U.S. patent application Ser. No. 10/368,160, entitled "MEMS Enhanced Capacitive Pick-off and Electrostatic Rebalance Electrode Placement," filed in the names of Aiwu Yue and Ronald B. Leonardson on Feb. 18, 2003, which is incorporated herein by reference. The electrostatic OPA employs a flexibly suspended pendulous proof mass which form different sets of capacitors with stationary electrodes formed on each of the opposing cover plates. Movement of the pendulous proof mass in response to acceleration changes its position relative to the stationary electrodes, thereby causing a change in pick-off capacitance. This change in pick-off capacitance is an indication of acceleration. In a closed-loop device, a set of capacitors for electrostatic rebalance is formed between of the pendulous proof mass and stationary feedback electrodes for driving the pendulous proof mass to a reference position between the opposing cover plates and maintaining it there. In the electrostatic OPA of the invention, the mechanical features 24 include the pendulous proof mass contained within the device mechanism layer 10 with the sense and drive regions residing on the cover plates 12, 14. Generally, the improvements in performance described in this invention apply to both EPA and OPA type accelerometer and rate gyro devices and the methods of fabrication are substantially identical.

Figure 10:
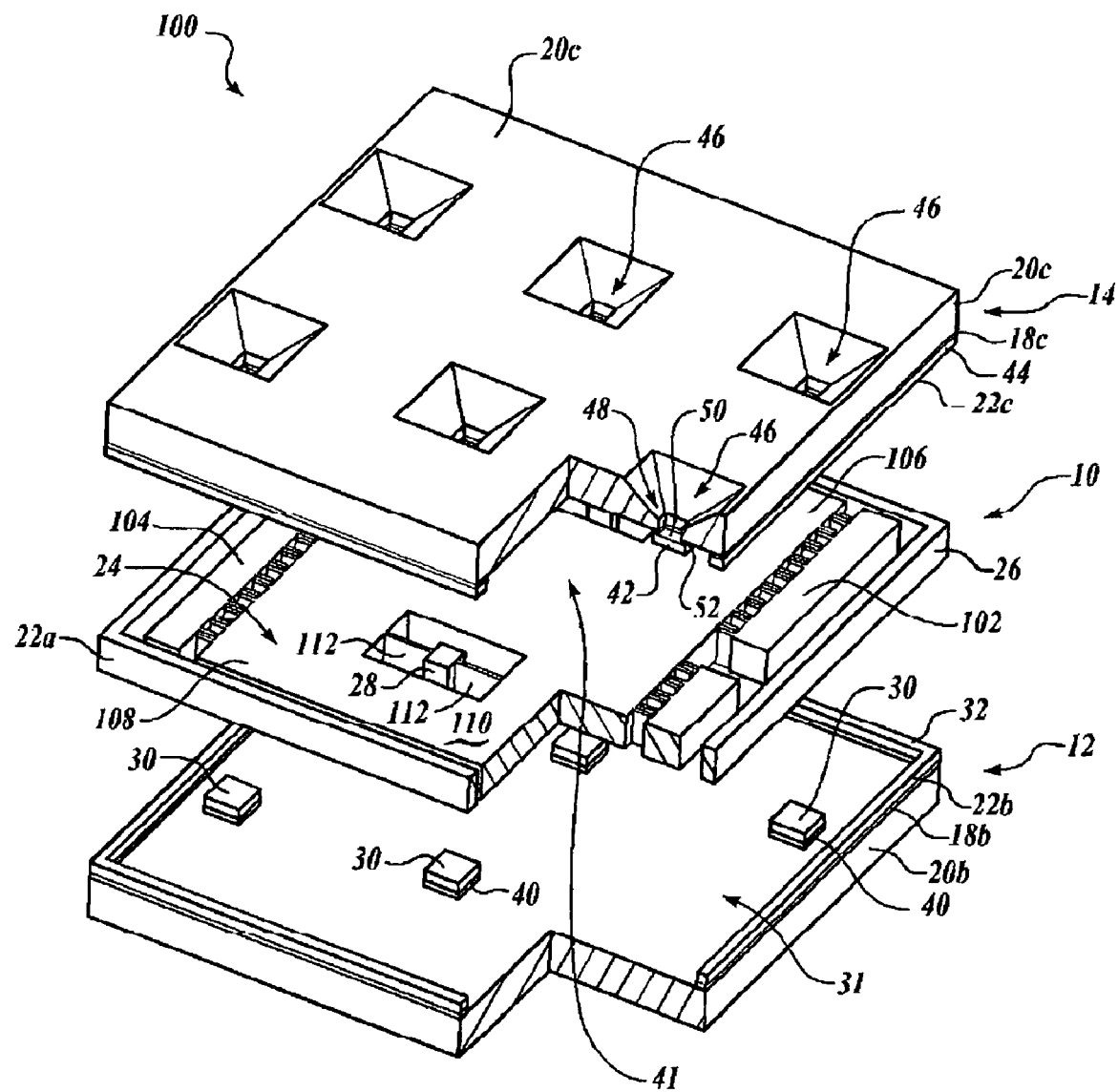
FIG. 10 is a perspective exploded view of the MEMS device of the invention embodied by example and without limitation as a simple electrostatic IPA die stack.

FIG. 10 is a perspective exploded view of the MEMS device 1 of the invention embodied by example and without limitation as a simple electrostatic IPA die stack 100 according to the invention configured as a simple sense and drive comb-type accelerometer. The simple example is intended to explain the invention without limiting the claimed invention. The exemplary IPA die stack 100 includes the device sensor mechanism 10 formed in the active layer 22a of the mechanism SOI wafer element 16a and the cooperating interior cover plate features 31, 41 formed in the active layers 22b, 22c of the cover plate SOI wafer elements 16b, 16c. The exemplary device sensor mechanism 10 includes the device mechanical features 24 formed in the mechanism active layer 22a surrounded by the continuous marginal frame 26 that is also formed in the mechanism active layer 22a. Mechanism anchors 28 are provided in the mechanism active layer 22a for structurally support the IPA mechanical features 24. In the simple example IPA 100, the mechanical features 24 include four comb sections 102, 104, 106, 108. A first two of the comb sections 102, 104 are fixed to the first cover plate 12 by fusion or eutectic bonding to different pairs of the cover plate anchors 30. Another pair of the cover plate anchors 30 support a translational proof mass 110 through one or more mechanism anchors 28. The proof mass 110 is optionally mechanically suspended for translational within the plane of the mechanism wafer element 16a on one or more flexures 112 formed in the mechanism active layer 22a between the proof mass 110 and the mechanism anchors 28 which support it. In a closed-loop IPA device 100, any of the fixed comb sections 102, 104 is operated either for sense output or drive input. The IPA device 100 is optionally structured in any of many other possible configurations. For example, in an open-loop IPA configuration, all of the comb sections 102, 104, 106, 106 are operated as pick-off or sense output portions.

Figure 11:
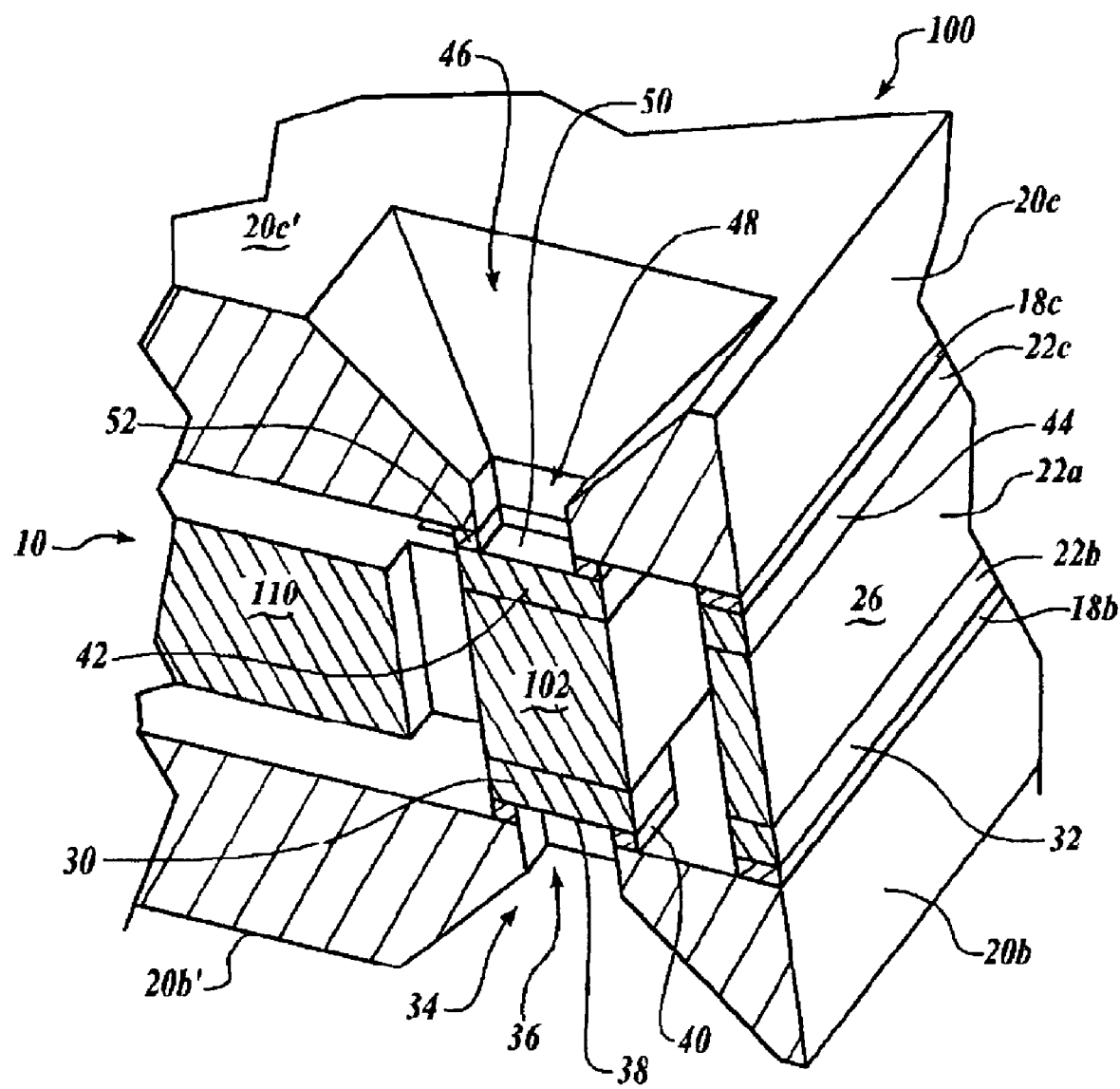
FIG. 11 is a perspective enlargement of one portion of the simple example IPA (in-plane accelerometer) die stack of the invention after assembly.

FIG. 11 is a perspective enlargement of one portion of the simple example IPA die stack 100 after assembly that shows the fixed comb section 102 of the simple device sensor mechanism 10 coupled to the cover plate anchors 30 in the first and second cover plates 12, 14. Each of the comb sections 102, 104 is supported by cover plates 12, 14 from below and above, and each of the comb sections 102, 104 is electrically isolated by the $SiO_2$ material of the dielectric layers 18b, 18c that separates the active layers 22b, 22c from the handle layers 20b, 20c in the respective cover plates 12, 14. The pit features 34, 46 provide openings in the respective cover plates 12, 14 that expose the active layers 22b, 22c adjacent to and in alignment with the cover anchors 30, 42 so that an electrical connection can be later made via the mechanically bonded wires 68 or stud bumps 66. Accordingly, the fixed comb sections 102 is supported from both sides, i.e. top and bottom, while it remains electrically isolated from the cover plates 12, 14 and other of the IPA mechanical features 24 by the respective marginal rims 40, 52 of dielectric material retained around each of the cover plate anchors 30, 42. As shown, the IPA mechanical features 24 are structurally supported by the cover plate anchors 30, 42 in the first and second cover plates 12, 14.

The pit features 34, 46 and channels 36, 48 provide access to the inside surfaces 38, 50 of the cover plate anchors 30, 42 in the first and second cover plates 12, 14, respectively. In a later operation, bond wire pads 54, 56 are deposited on the cover plate anchor inside surfaces 38, 50 through the pit features 34, 46 and channels 36, 48. The pit features 34, 46 and channels 36, 48 also provide access for wire bonding in a later operation. Alternatively, the additional insulator material 58 and electrically conductive trace 62 are deposited between one or both the cover plate anchor inside surfaces 38, 50 (shown) of the cover plate anchors 30, 42 (shown) up the inside wall surfaces 60 and onto the exterior surface 20b', 20c' (shown) of the bottom or top (shown) cover plate handle layer 20b, 20c. After the stud bump 66 is formed, the IPA die stack 100 is ready for bonding in a conventional flip chip assembly process.

Figure 12:
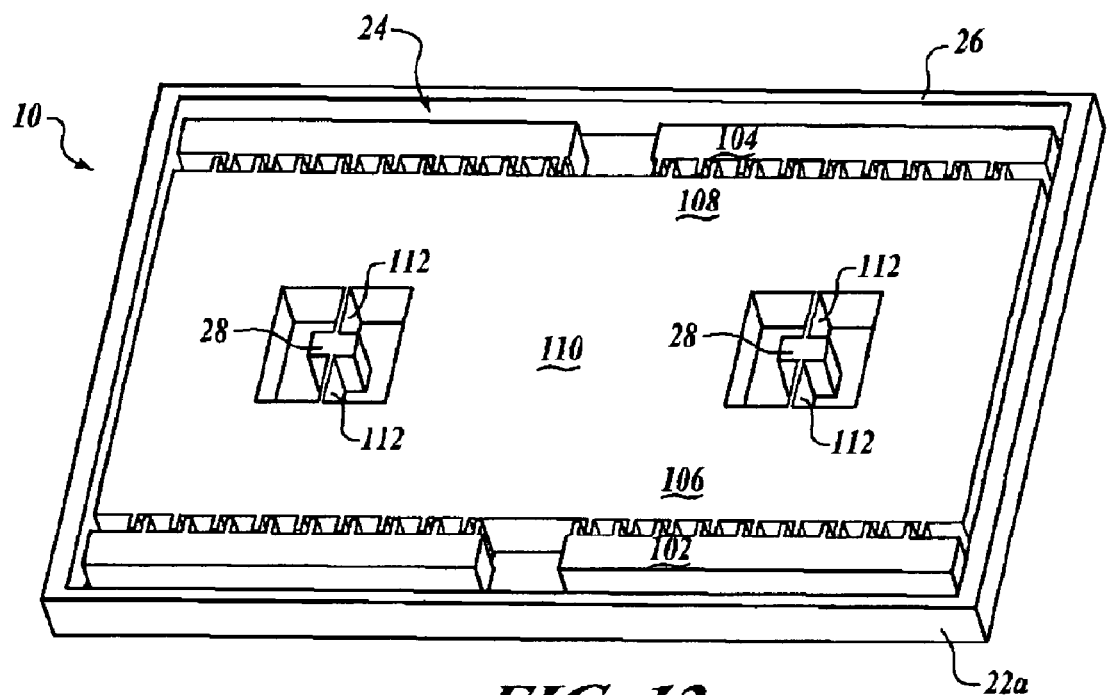
FIG. 12 is a perspective view of the simple device sensor mechanism of the simple example IPA die stack of the invention formed in the active layer of the mechanism SOI wafer element and having IPA mechanical features surrounded by a continuous marginal frame.

FIG. 12 is a perspective view of the simple device sensor mechanism 10 of the simple example IPA die stack 100 formed in the active layer 22a of the mechanism SOI wafer element 16a and having the IPA mechanical features 24 surrounded by the continuous marginal frame 26, as described herein. As shown, the proof mass 110 is mechanically suspended for translational within the plane of the mechanism wafer element 16a on a pair of the flexures 112 formed in the mechanism active layer 22a between the proof mass 110 and the mechanism anchors 28 which support it. The mechanism anchors 28 are positioned in a matching pattern to the cover plate anchors 30, 42.

Figure 13:
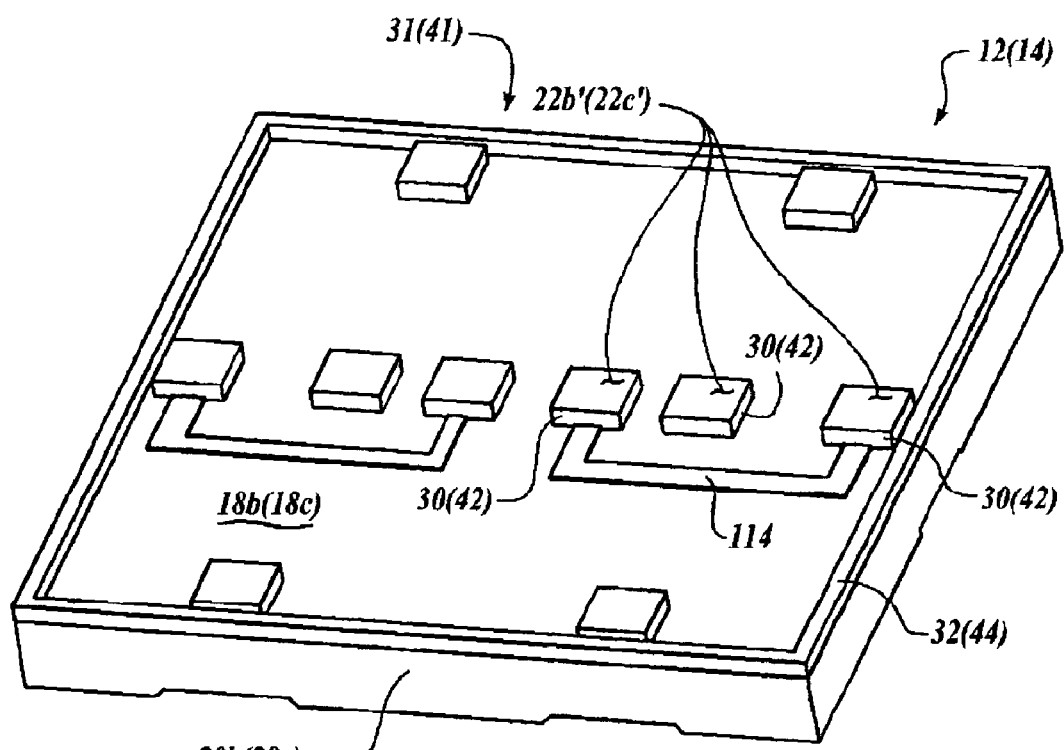
FIG. 13 is a perspective view that illustrates both the first and second cover plates of the invention, including the cooperating interior cover plate features formed in the inside or active layer of the respective first and second cover plates.

FIG. 13 is a perspective view that illustrates both the first and second cover plates 12, 14, including the cooperating interior cover plate features 31, 41 formed in the inside or active layer 22b, 22c of one of the first and second cover plates 12, 14. The cooperating interior cover plate features 31, 41 include a quantity of electrically conductive connectors 114 between internal electrical sections of the simple device sensor mechanism 10 of the simple example IPA die stack 100. Electrical connections are optionally made in either one or both the first bottom and second top cover plates 12, 14 using one or more of the electrically conductive connectors 114 in combination with two or more of the cover plate anchors 30, 42. The two or more cover plate anchors 30, 42 are coupled to the portions of the IPA device mechanical features 24 by the fusion or eutectic bond joint at the interface between the first surface 22a' of the mechanism active layer 22a and the surface 22b' of the first cover plate active layer 22b, and the bond joint at the interface between the second active layer surface 22a" and the second cover plate active layer surface 22c'. The connectors 114 are formed in the semiconductor material of the first and second cover plate active layers 22b, 22c and therefore provide electrically conductive paths between the different cover plate anchors 30, 42 interconnected thereby. The fusion or eutectic bond joint provides electrically conductive paths between the different cover plate anchors 30, 42 and the mechanism active layer 22a. The connectors 114 are thus structured to carry electrical signals between different portions of the IPA device mechanical features 24 bonded to the different cover plate anchors 30, 42 that are interconnected by the connectors 114. The different connectors 114 and the different cover plate anchors 30, 42 interconnected thereby are isolated from other portions of the cover plate active layer 22b, 22c by physical separation and the layer 18b, 18c of dielectric material that isolates the connectors 114 and cover plate anchors 30, 42 from the semiconductor cover plate handle layer 20b, 20c. Accordingly, the connectors 114 provide means for shunting electrical signals between different portions of the device mechanical features 24 that are otherwise electrically isolated from one another by physical separation and the dielectric layer 18b, 18c. For example, one of the connectors 114 electrically interconnects the fixed comb sections 102, 104 in the device mechanism active layer 22a by electrically interconnecting a pair of the cover plate anchors 30, 42 that are fusion or eutectic bonded to the different fixed comb sections 102, 104 so as to carry a common signal between the two portions of the IPA device mechanical features 24. Thus, when multiple portions of the device mechanical features 24 carry the same common signal, such as the multiple fixed comb sections 102, 104, they are electrically interconnected internal to the device 100 within one of the cover plates 12, 14. An additional advantage of electrically interconnecting internal of the cover plate 12, 14 the different portions of the device mechanical features 24 that carry the same common signal is a single wire bond is capable of carrying the common signal for all of the different portions. Thus, multiple wire bonds for the same signal are avoided.

Optionally, only a single pit feature 34 or 46 is provided for access to the common signal shared by the multiple different portions of the device mechanical features 24. Accordingly, one pit feature 34 or 46 is formed in the cover plate 12 or 14 in alignment with one of the cover plate anchors 30, 42 that is coupled by the connector 114 to carry the common signal. However, an additional pit feature 34 or 46 is optionally formed in the cover plate 12 or 14 in alignment with each of the cover plate anchors 30 or 42 coupled by the connector 114 to carry the common signal to provide symmetry in the device 100. Alternatively, the common signal carried by the connector 114 to different portions of the device mechanical features 24 is of a type that is internal to the mechanism, i.e. not an input or an output signal, so that a wire bond or other input/output signal carrier is unnecessary. In such instance, the common signal is carried entirely within the handle layer 20b or 20c of the cover plate 12 or 14 without providing a pit feature 34 or 46 for access to any of the associated cover plate anchors 30 or 42. Thus, one or more of the cover plate anchors 30 or 42 may be provided without an associated pit feature 34 or 46 in the cover plate handle layer 20b or 20c.

Simultaneously with carrying common signals between multiple portions of the device mechanical features 24, the connectors 114 provide a means to isolate different electrical signals within the device 100 by physical separation between the different connectors 114 and the dielectric layer 18b or 18c. The number of different electrical signals depends upon the device design. However, such devices typically have from 2 to 8 different signals.

The connectors 114 are recessed below or set-back from the finished surface 22b' or 22c' of the majority of cooperating interior cover plate features 31 or 41 that are formed in the active layer 22b or 22c' of the cover plate 12 or 14. By example and without limitation, the connectors 114 are formed in the cover plate active layer 22b or 22c recessed below or set-back from the active layer surface 22b' or 22c' by interruption of the cover plate etching process, and masking of portions of the active layer 22b or 22c along selected paths between selected cover plate anchors 30 or 42. The recess or set-back is thus provided at an intermediate stage the cover plate etch process, and the connectors 114 are exposed in the active layer 22b or 22c along the selected paths by continued etching through to the underlying oxide layer 18b or 18c. The connectors 114 are thus recessed below or set-back from the active layer surface 22b' or 22c' of the cover plate anchors 30 or 42 and the marginal rim 32 or 44 of the cover plate 12 or 14, which physically and electrically isolates the connectors 114 from the device mechanical features 24, except through the associated cover plate anchors 30 or 42.

Figure 14:
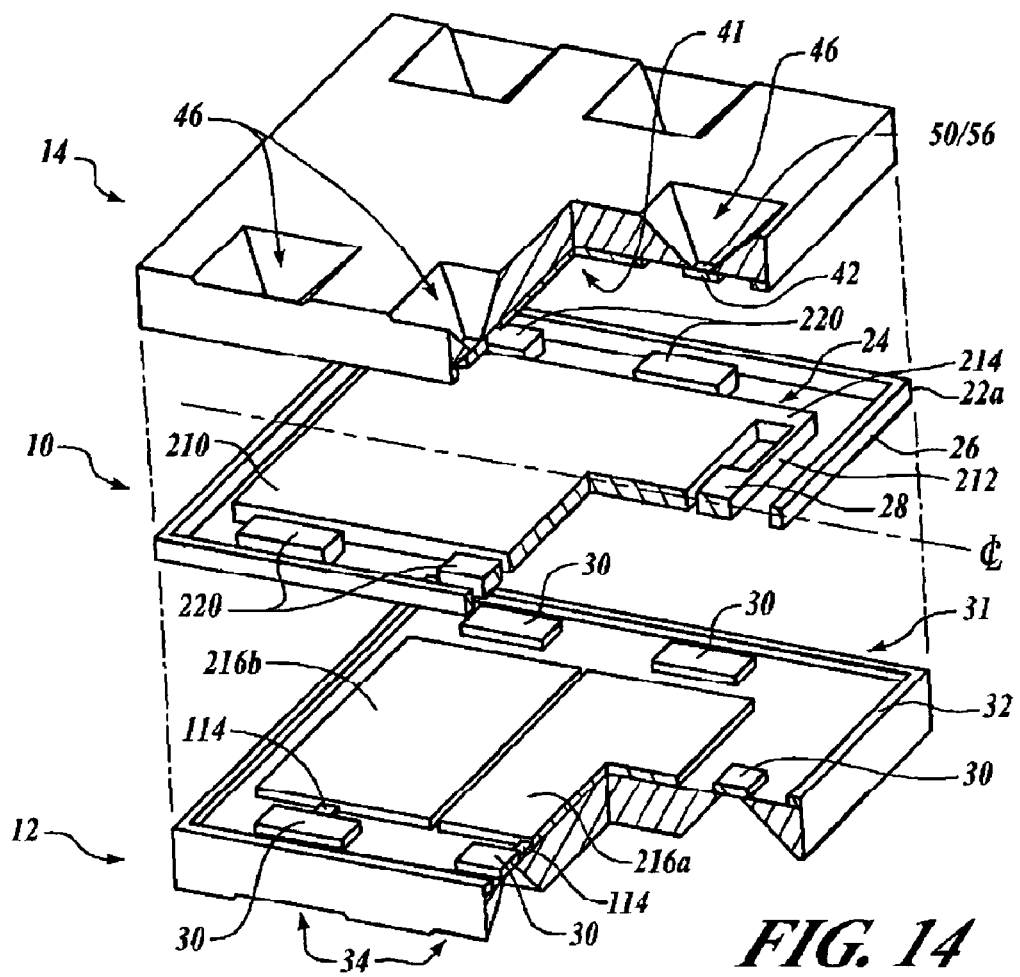
FIG. 14 is a perspective exploded view of the MEMS device of the invention embodied by example and without limitation as a simple electrostatic OPA (out-of-plane accelerometer) die stack according to the invention.

FIG. 14 is a perspective exploded view of the MEMS device 1 of the invention embodied by example and without limitation as a simple electrostatic OPA (out-of-plane accelerometer) die stack 200 according to the invention configured as a simple pendulous accelerometer having the mechanism layer 10 sandwiched between the two cover plates 12, 14. The simple example is intended to explain the invention without limiting the claimed invention. The exemplary OPA die stack 200 includes the device sensor mechanism 10 formed in the active layer 22*a* of the mechanism SOI wafer element 16*a* and the cooperating interior cover plate features 31, 41 formed in the active layers 22*b*, 22*c* of the cover plate SOI wafer elements 16*b*, 16*c*. The exemplary device sensor mechanism 10 includes the mechanical features 24 of the OPA device 200 surrounded by the continuous marginal frame 26. Mechanism anchors 28 are provided in the mechanism active layer 22*a* for structurally support the OPA mechanical features 24. In the simple example OPA 200, the mechanical features 24 include a flexibly suspended pendulous proof mass 210 flexibly suspended by one or more flexures 212 from a stationary frame 214. The stationary frame 214 contains one or more of the mechanism anchors 28 which are fixed to one or both cover plates 12, 14 by fusion or eutectic bonding to respective cover plate anchors 30, 42. One or more input and output electrical signals are conducted between the pendulous proof mass 210 and one or more of the cover plate anchors 30, 42 through the mechanism anchors 28.

In a closed-loop OPA device 200, the proof mass 210 is matched to fixed excitation and feedback electrode plates 216*a*, 216*b* as part of the cooperating interior cover plate features 31 formed in the inside or active layer 22*b* of the first or bottom cover plate 12.

The fixed electrode plates 216*a*, 216*b*, which are mirrored by matching electrode plates in the second or top cover plate active layer 22*c* as part of the cooperating interior cover plate features 41, are recessed below or set-back from the finished surface 22*b'* or 22*c'* of the majority of cooperating interior cover plate features 31, 41 that are formed in the active layers 22*b*, 22*c* of the respective cover plates 12, 14 to provide space for out-of-plane motion of the proof mass 210 in response to an acceleration input having a component perpendicular to the plane of the device sensor mechanism 10. By example and without limitation, the fixed electrode plates 216*a*, 216*b* are formed in one or both the cover plate active layers 22*b*, 22*c* recessed slightly, e.g. about 3 microns, below or set-back from the active layer surface 22*b'*, 22*c'* by interruption of the cover plate etching process, and masking of portions of the active layer 22*b*, 22*c* in the area of the electrode plates 216*a*, 216*b*. The recess or set-back is thus provided early in the cover plate etch process, and the electrode plates 216*a*, 216*b* are exposed in the active layer 22*b*, 22*c* opposite the proof mass 210 by continued etching through to the underlying oxide layer 18*b*, 18*c*. The electrode plates 216*a*, 216*b* are thus slightly recessed below or set-back from the active layer surface 22*b'*, 22*c'* of the cover plate anchors 30, 42 and the marginal rim 32, 44 of the respective cover plate 12, 14, which physically and electrically isolates the electrode plates 216*a*, 216*b* from the remainder of the respective cover plate active layer 22*b*, 22*c*.

The fixed electrode plates 216*a*, 216*b* of the cooperating interior cover plate features 31 and 41 are operated as excitation and feedback electrodes for receiving stimulating and electrostatic rebalance signals, respectively. Alternatively, the fixed electrode plates 216*a*, 216*b* are combined in a single electrode plate having a feedback signal superimposed on the excitation signal. The OPA device 200 is optionally structured in any of many other possible configurations. For example, in an open-loop OPA configuration, the fixed electrode plates 216*a*, 216*b* are combined and operated as a single pick-off or sense output portion.

In one example, the fixed electrode plates 216*a*, 216*b* in the cover plate 12 are electrically coupled to different cover plate anchors 30 by different electrically conductive connectors 114 formed as part of the cooperating interior cover plate features 31, 41 in the semiconductor material of the cover plate active layer 22*b*. The connectors 114 thus provide isolated electrically conductive paths between different internal electrical sections of the cover plate active layer 22*b*, while providing access to input and output signals by connecting the different internal electrical sections to different cover plate anchors 30. Access to the signals on the different cover plate anchors 30 is provided by the associated pit features 34, as discussed herein.

According to one embodiment of the invention, one or more shunt anchors 220 are provided as part of the cooperating interior cover plate features 31, 41 in the semiconductor active layer 22*a* of the mechanism SOI wafer element 16*a* for conducting electrical signals between the cover plates 12, 14. For example, one or more of the shunt anchors 220 are formed in the mechanism active layer 22*a* physically simultaneously with and in the same manner as the mechanism anchors 28, except the shunt anchors 220 are isolated from the operational mechanical features 24 of the device 200, which simultaneously provides mutual electrical isolation. When coupled by fusion or eutectic bonding to matching cover plate anchors 30, 42 of the cooperating interior cover plate features 31, 41, each shunt anchor 220 operates to conduct input or output electrical signals between the cover plates 12, 14. Thus, electrical input and output signals are communicated to and from the bottom cover plate 12 through different pit features 46 in the top cover plate 14 by conduction through the semiconductor shunt anchors 220 coupled between matching cover plate anchors 30, 42 in the cover plates 12, 14. While the electrical signals on the bottom cover plate 12 are thus accessible through pit features 46 in the top cover plate 14, matching pit features 30 are optionally formed in the bottom cover plate 12 at each of the shunt anchors 220 to provide device symmetry about the mid-plane of the device 200.

In an open-loop OPA device, two anchor columns 222 (shown in FIG. 15), each formed of a mechanism shunt anchor 220 in combination with a cover plate anchor 30 in the first cover plate 12 and a cover plate anchor 42 in the second cover plate 14, carry an excitation signal, one to each cover plate electrode 216*a*, 216*b*. When pit features 34, 46 are formed for both first and second cover plate anchors 30, 42, the excitation signal is put in at either the first or second cover plate 12, 14. In a closed-loop device, four anchor columns 222 are provided, two anchor columns 222 for each cover plate 12, 14 with one carrying the sense signal and the other carrying the drive signal. In two of these anchor columns 222, the entire anchor column 222 is used to communicate the signal to the opposite cover plate. The anchor columns 222 and cooperating pit features 34, 46 in the cover plates 12, 14 are optionally provided positioned relative to one another to provide device symmetry about the proof mass centerline CL and about the mid-plane of the device 200.

Figure 15:
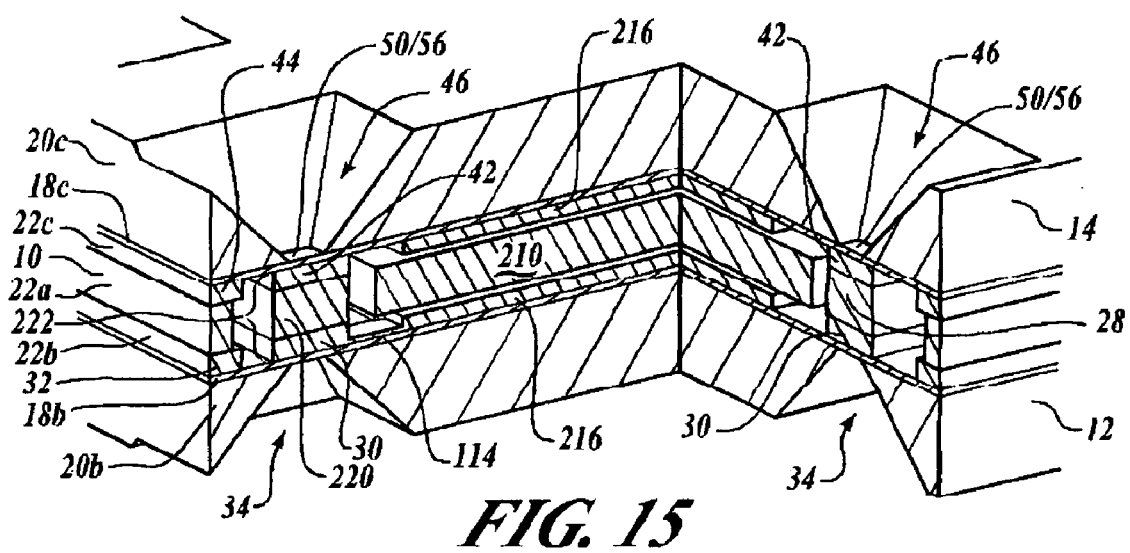
FIG. 15 is a perspective enlargement of one portion of the simple example OPA die stack of the invention after assembly.

FIG. 15 is a perspective enlargement of one portion of the simple example OPA die stack 200 after assembly that shows the flexibly suspended pendulous proof mass 210 of the simple OPA device sensor mechanism 10 coupled to the cover plate anchors 30 in the first and second cover plates 12, 14 by means of the one or more mechanism anchors 28 formed in the stationary frame 214. The pendulous proof mass 210 is supported by cover plates 12, 14 from below and above by the cover anchors 30, 42, and furthermore that the pendulous proof mass 210 is electrically isolated by the $SiO_2$ material of the dielectric layers 18*b*, 18*c* that separates the cover anchors 30, 42 from the handle layers 20b, 20c in the respective cover plates 12, 14.

The pit features 34, 46 provide openings in the respective cover plates 12, 14 that expose the active layers 22b, 22c adjacent to and in alignment with the respective cover anchors 30, 42 so that an electrical connection can be later made via the mechanically bonded wires 68 or stud bumps 66. Accordingly, the proof mass stationary frame 214 is supported from both sides, i.e. top and bottom, while it remains electrically isolated from the cover plates 12, 14 and other of the OPA mechanical features 24 by the respective marginal rims 40, 52 of dielectric material retained around each of the cover plate anchors 30, 42. As shown, the OPA mechanical features 24 are structurally supported by the cover plate anchors 30, 42 in the first and second cover plates 12, 14.

The pit features 34, 46 and channels 36, 48 provide access to the inside surfaces 38, 50 of the cover plate anchors 30, 42 in the first and second cover plates 12, 14, respectively. In a later operation, bond wire pads 54, 56 are deposited on the cover plate anchor inside surfaces 38, 50 through the pit features 34, 46 and channels 36, 48. The pit features 34, 46 and channels 36, 48 also provide access for wire bonding in a later operation. Alternatively, the additional insulator material 58 and electrically conductive trace 62 are deposited between the cover plate anchor inside surfaces 38 or 50 (shown) of the cover plate anchors 30 or 42 (shown) up the inside wall surfaces 60 and onto the exterior surface 20b' or 20c' (shown) of the bottom or top (shown) cover plate handle layer 20b or 20c (shown). After the stud bump 66 is formed, the OPA die stack 200 is ready for bonding in a conventional flip chip assembly process.

Figure 16:
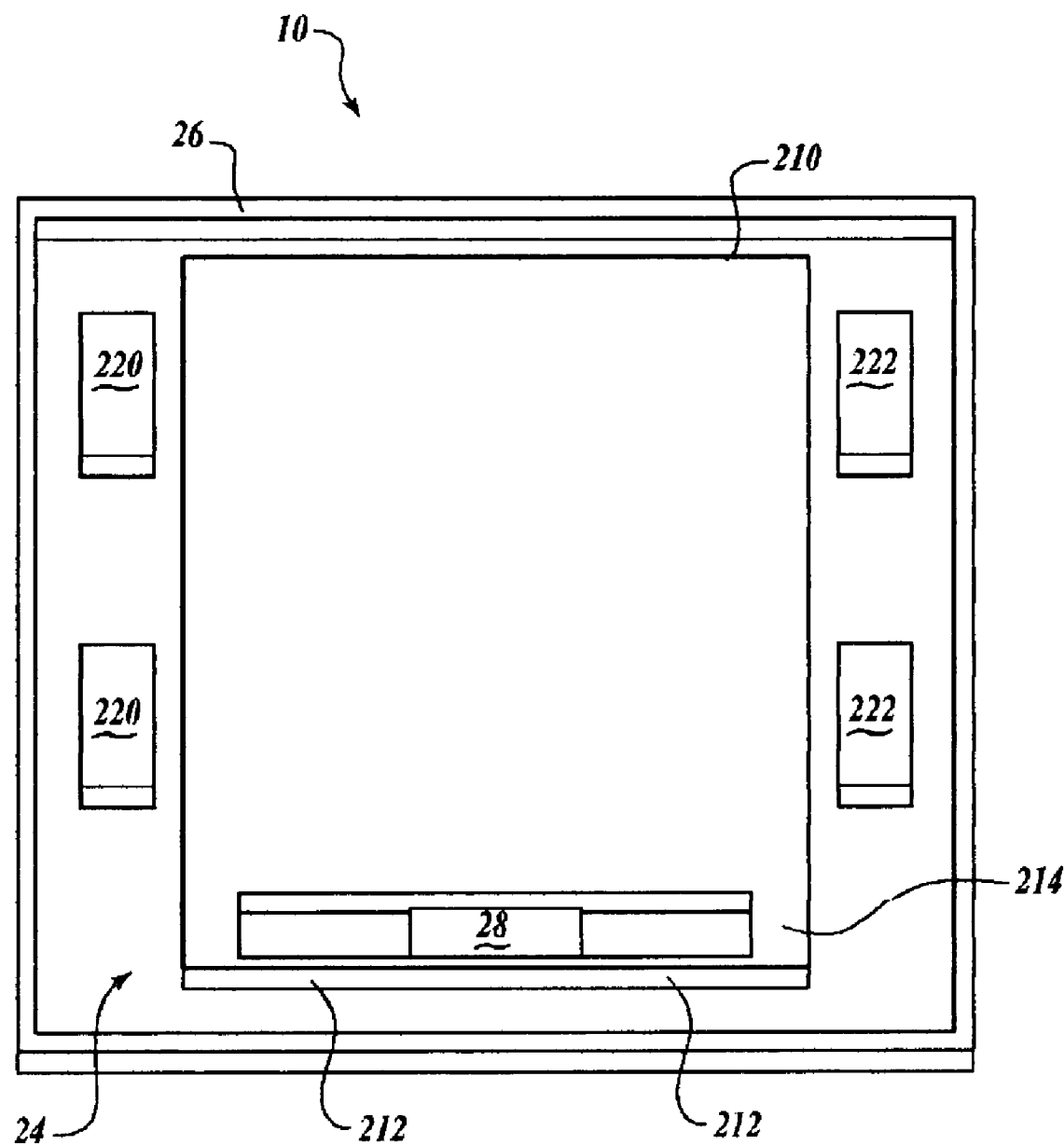
FIG. 16 is a perspective view of the simple device sensor mechanism of the simple example OPA die stack of the invention formed in the active layer of the mechanism SOI wafer element and having the OPA mechanical features surrounded by a continuous marginal frame.

FIG. 16 is a perspective view of the simple device sensor mechanism 10 of the simple example OPA die stack 200 formed in the active layer 22a of the mechanism SOI wafer element 16a and having the OPA mechanical features 24 surrounded by the continuous marginal frame 26, as described herein. As shown, the proof mass 110 is mechanically suspended from the stationary frame 214 for rotation within out of the plane of the mechanism wafer element 16a on a pair of the flexures 212 formed in the mechanism active layer 22a between the proof mass 210 and the one or more mechanism anchors 28 which support it. The one or more mechanism anchors 28 are positioned in a matching pattern to the cover plate anchors 30, 42.

The simple device sensor mechanism 10 of the simple example OPA die stack 200 also includes both the one or more electrically conductive shunt anchors 220 combined in anchor columns 222 for conducting drive and sense signals during operation of the OPA device 200. All the mechanical features 24 of the simple OPA device sensor mechanism 10, including the proof mass 210, flexures 212, frame 214 and mechanism anchors 28, as well as the shunt anchors 220, and marginal frame 26, are formed the substantially identical full thickness of the mechanism active layer 22a. Accordingly, the mechanism anchors 28 and shunt anchors 220 as well as the marginal frame 26 contact the surfaces 22b', 22c' of the cover plate active layers 22b, 22c for making hermetic seals therewith when joined by either fusion or eutectic bonding.

Figure 17:
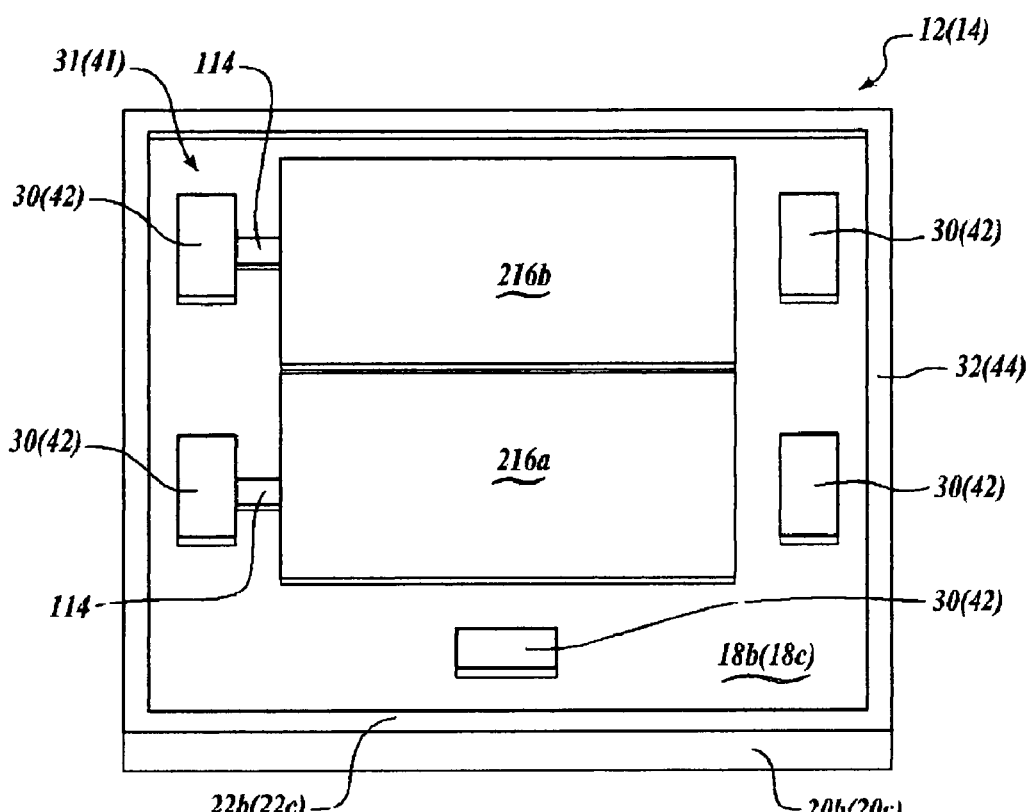
FIG. 17 is a perspective view that illustrates both the first and second cover plates of the invention, including the cooperating interior cover plate features formed in the inside or active layer of the respective first and second cover plates.

FIG. 17 is a perspective view that illustrates both the first and second cover plates 12, 14, including the cooperating interior cover plate features 31, 41 formed in the inside or active layer 22b, 22c of the respective first and second cover plates 12, 14. The cooperating interior cover plate features 31, 41 include a quantity of the electrically conductive connectors 114 between internal electrical sections of the cover plate active layer 22b, 22c of the simple example OPA die stack 200. Electrical connections are optionally made in either one or both the first bottom and second top cover plates 12, 14 using one or more of the electrically conductive connectors 114 formed as part of the cooperating interior cover plate features 31, 41 for electrically interconnecting each of the fixed electrode plates 216a, 216b in the cover plate active layer 22b, 22c to different ones of the cover plate anchors 30, 42. The connectors 114 are formed in the semiconductor material of the cover plate active layer 22b, 22c and therefore provide electrically conductive paths between the electrode plates 216a, 216b and the different cover plate anchors 30, 42 interconnected thereby.

The connectors 114 are thus structured to carry electrical signals between different portions of the OPA device cover plate active layer 22b, 22c that are interconnected to the different cover plate anchors 30, 42 by the connectors 114. The different connectors 114 and the different portions of the cover plate active layer 22b, 22c interconnected thereby are isolated from other portions of the cover plate active layer 22b, 22c by physical separation and the layer 18b, 18c of dielectric material that isolates the connectors 114, the fixed electrode plates 216a, 216b and the cover plate anchors 30, 42 from the respective semiconductor cover plate handle layer 20b, 20c. Accordingly, the connectors 114 provide means for shunting electrical signals to and from electrode plates 216a, 216b that are otherwise electrically isolated by the respective cover plate dielectric layer 18b, 18c. For example, one of the connectors 114 provides electrical access to one of the electrode plates 216a by electrically interconnection to one of the cover plate anchors 30. 42 so as to carry an electrical signal between the electrode plate 216a and the cover plate anchor inside surface 38, 50 exterior of the OPA device 200. Another one of the connectors 114 provides electrical access to the other electrode plate 216b by electrically interconnection to one of the cover plate anchors 30, 42 so as to shunt an electrical signal between the electrode plate 216b and the cover plate anchor inside surface 38, 50. Optionally, only a single pit feature 34 or 46 is provided for access to each electrode plate 216a, 216b. Accordingly, one pit feature 34 or 46 is formed in the respective cover plate 12 or 14 for each electrode plate 216a, 216b to access the signal at the cover plate anchors 30 or 42. However, an additional pit feature 34 or 46 is optionally formed in the opposing cover plate 14 or 12 in alignment with each of the respective cover plate anchors 42 or 30 coupled by the connector 114 to provide symmetry in the device 200.

According to one embodiment of the invention, cover plate anchors 30, 42 and associated pit features 34, 46 are formed in the respective cover plates 12, 14 in positions matched to each of the one or more mechanism shunt anchors 220.

Figure 18:
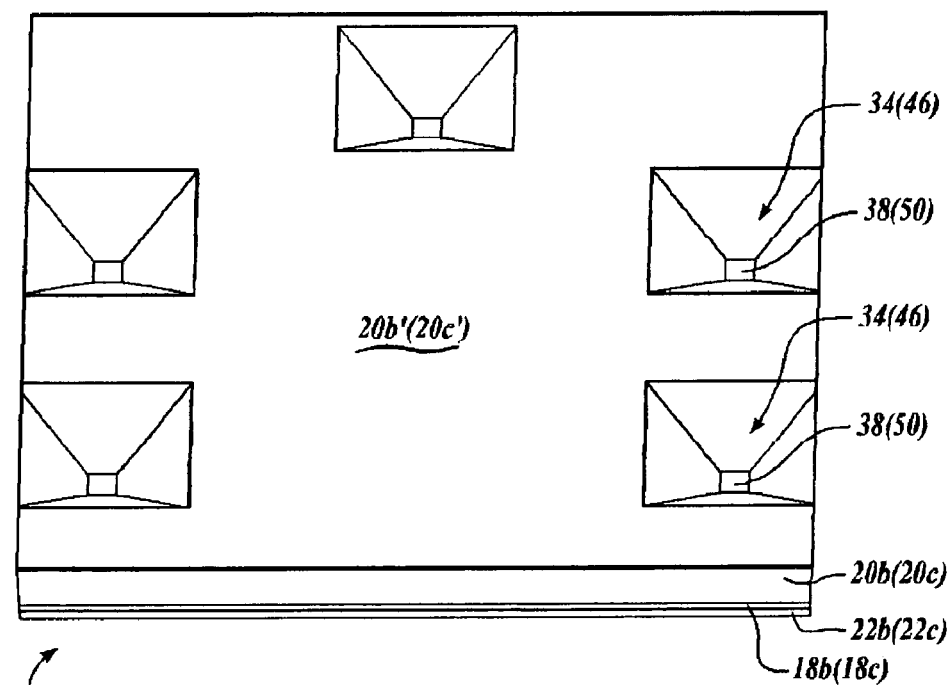
FIG. 18 is a perspective view that illustrates the external surface of the handle layer of both the first and second cover plates having respective pit features of the invention formed therein aligned inside surface of the associated cover plate anchors of the invention.

FIG. 18 is a perspective view that illustrates the external surface 20b', 20c' of the handle layer 20b, 20c of both the first and second cover plates 12, 14 having respective pit features 34, 46 formed therein for exposing the inside surface 38, 50 of the associated cover plate anchors 30, 42 aligned therewith.

Figure 19:
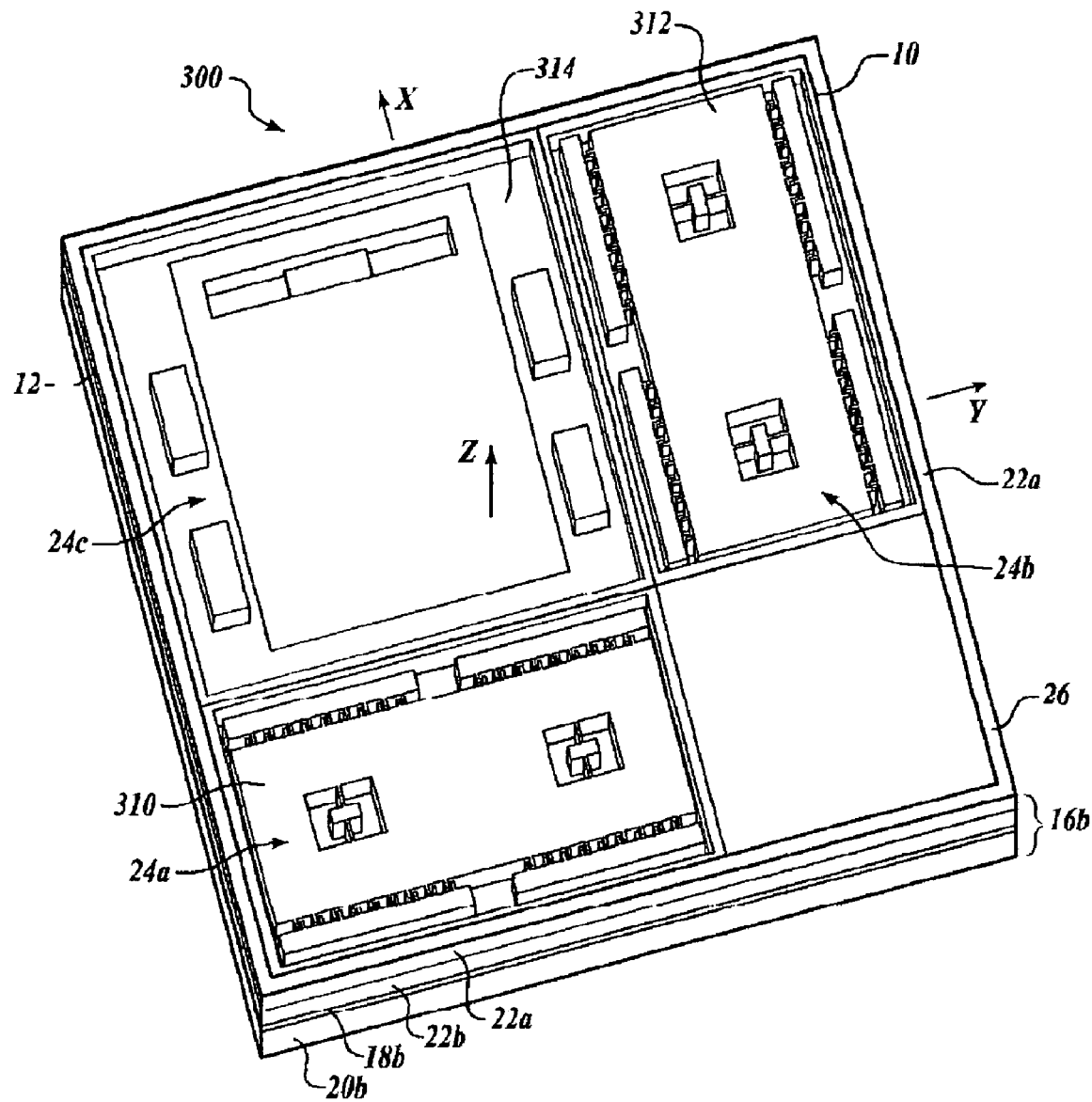
FIG. 19 illustrates a perspective view of the MEMS device of the invention embodied by example and without limitation as a simple tri-axial MEMS accelerometer device according to one embodiment of the invention having two IPA and one OPA arranged in a single device sensor mechanism sandwiched between a single first or bottom cover plate and a single second or top cover plate.

FIG. 19 illustrates a perspective view of the MEMS device 1 of the invention embodied by example and without limitation as a simple tri-axial MEMS accelerometer device 300 according to one embodiment of the invention having two IPA 310, 312 and one OPA 314 arranged in a single device sensor mechanism 10 sandwiched between a single first or bottom cover plate 12 and a single second or top cover plate 14. The top cover plate 14 is omitted for clarity. The simple example is intended to explain the invention without limiting the claimed invention. The two IPA 310, 312 and the OPA 314 are optionally configured as either open-loop or closed-loop devices of the types described herein. The two IPA 310, 312 and the OPA 314 are arranged in the single mechanism active layer 22a to operate along mutually orthogonal axes X, Y, Z. By example and without limitation, the two IPA 310, 312 are configured to operate along respective mutually orthogonal X, Y axes, while the OPA 314 is configured to operate along the mutually orthogonal Z axis. FIG. 19 illustrates by example and without limitation only one of many optional arrangements of the two IPA 310, 312 and the OPA 314.

The two EPA 310, 312 and the OPA 314 are, by example and without limitation, of the simple exemplary types illustrated and describe in detail herein. The single device sensor mechanism 10 of the tri-axial MEMS accelerometer device 300 includes two sets of IPA mechanical features 24a and 24b and a single set of OPA mechanical features 24c all formed in the active layer 22a of a single mechanism SOI wafer element 16a.

The two exemplary EPA 310, 312 are independent electrostatic IPA die stacks of the type of simple sense and drive comb-type electrostatic IPA 100 described herein. Thus, the IPA mechanical features 24a, 24b of the respective exemplary IPA 310, 312 includes the four comb sections 102, 104, 106, 108 with two of the comb sections 102, 104 being fixed to one or both the first and second cover plates 12, 14 by fusion or eutectic bonding to different pairs of the cover plate anchors 30, 42. The IPA mechanical features 24a, 24b also include the translational proof mass 110 suspended from the pair of the mechanism anchors 28 by one or more of the flexures 112, the mechanism anchors 28 being supported relative to one or both the cover plates 12, 14 through bonding to another pair of the cover plate anchors 30, 42, as described herein.

The exemplary OPA 314 is an electrostatic OPA die stack of the type of simple pendulous-type electrostatic OPA die stack 200 described herein. Thus, the OPA mechanical features 24c of the exemplary OPA 314 includes the pendulous proof mass 210 flexibly suspended by the one or more flexures 212 from the stationary frame 214 which contains at least one of the mechanism anchors 28 that is fixed to one or both cover plates 12, 14 by fusion or eutectic bonding to respective cover plate anchors 30, 42, as described herein. According to one embodiment of the invention, the OPA mechanical features 24c include the shunt anchors 220 in anchor columns 222 for conducting electrical signals between the opposing cover plates 12, 14, as described herein.

The cover plates 12, 14 of the exemplary tri-axial MEMS accelerometer device 300 include the respective cooperating interior cover plate features 31, 41 formed in the active layers 22b, 22c of the respective cover plate SOI wafer elements 16b, 16c. The interior cover plate features 31, 41 being configured and arranged to cooperate with the mechanical features 24a, 24b of the respective exemplary IPA 310, 312 and with the mechanical features 24c of the exemplary OPA 314. Accordingly, the interior cover plate features 31, 41 of the respective cover plates 12, 14 include two sets of the cover plate anchors 30, 42 structured and arranged as described herein to cooperate with the fixed comb sections 102, 104 and the translational proof mass 110 of the respective exemplary IPA 310, 312, as well as the electrically conductive connectors 114 for carrying common signals between different portions of the IPA device mechanical features 24a, 24b, as described herein.

The interior cover plate features 31, 41 also include the fixed electrode plates 216a, 216b matched to the inboard and outboard portions 210a, 210b of the OPA proof mass 210, as well as the cover plate anchors 30, 42 structured and arranged as described herein to cooperate with the one or more mechanism frame anchors 28 for conducting input and output electrical signals to and from the OPA proof mass 210. The interior cover plate features 31, 41 also include cover plate anchors 30, 42 structured and arranged as described herein to cooperate with the one or more shunt anchors 220 in anchor columns 222 for conducting electrical signals between the cover plates 12, 14, as well as electrically conductive connectors 114 for carrying signals to between the fixed electrode plates 216a, 216b and the cover plate anchors 30, 42 associated with the shunt anchors 220. The interior cover plate features 31, 41 also include cover plate anchors 30, 42 structured and arranged as described herein to cooperate with the anchor columns 222 to provide symmetry about the mid-plane of the device 200.

Pit features 34, 46 are formed in the handle layers 20b, 20c of the first and second cover plates 12, 14 in alignment with one or more of the cover plate anchors 30, 42. Wire bond pads 54, 56 are deposited on the inside surfaces 36, 50 of the first and second cover plate anchors 30, 42 exposed at the bottom of the respective pit features 34, 46. Alternatively, additional insulator material 58 is provided on the inside wall surface 60 of the top cover plate pit features 46, and the electrically conductive trace 62 is deposited there over in electrical contact with the surfaces 50 of the second cover plate anchors 42 and having the electrically conductive trace portion 64 extending onto the exterior surface 20c' of the top cover plate handle layer 20c where the stud bump 66 is formed for bonding in a conventional flip chip assembly process, as described herein.

According to one embodiment of the invention, the single device sensor mechanism 10 of the tri-axial MEMS accelerometer device 300 includes the continuous marginal frame or rim 26 exposed in the active layer 22a of the mechanism SOI wafer element 16a, as disclosed herein. The marginal frame 26 is provided along a peripheral edge of the device sensor mechanism 10 completely surrounding the IPA and OPA mechanical features 24a, 24b, 24c. The matching marginal frames 32, 44 are formed in the active layers 22b, 22c of the cover plates 12, 14 for hermetically sealing the device sensor mechanism 10. The isolator flange 29 is optionally provided along the peripheral edge surface of the mechanism active layer 22a external of the IPA and OPA mechanical features 24a, 24b, 24c. The isolator flange 29 is coupled to an external peripheral edge surface 26a of the marginal frame 26.

Figure 20:
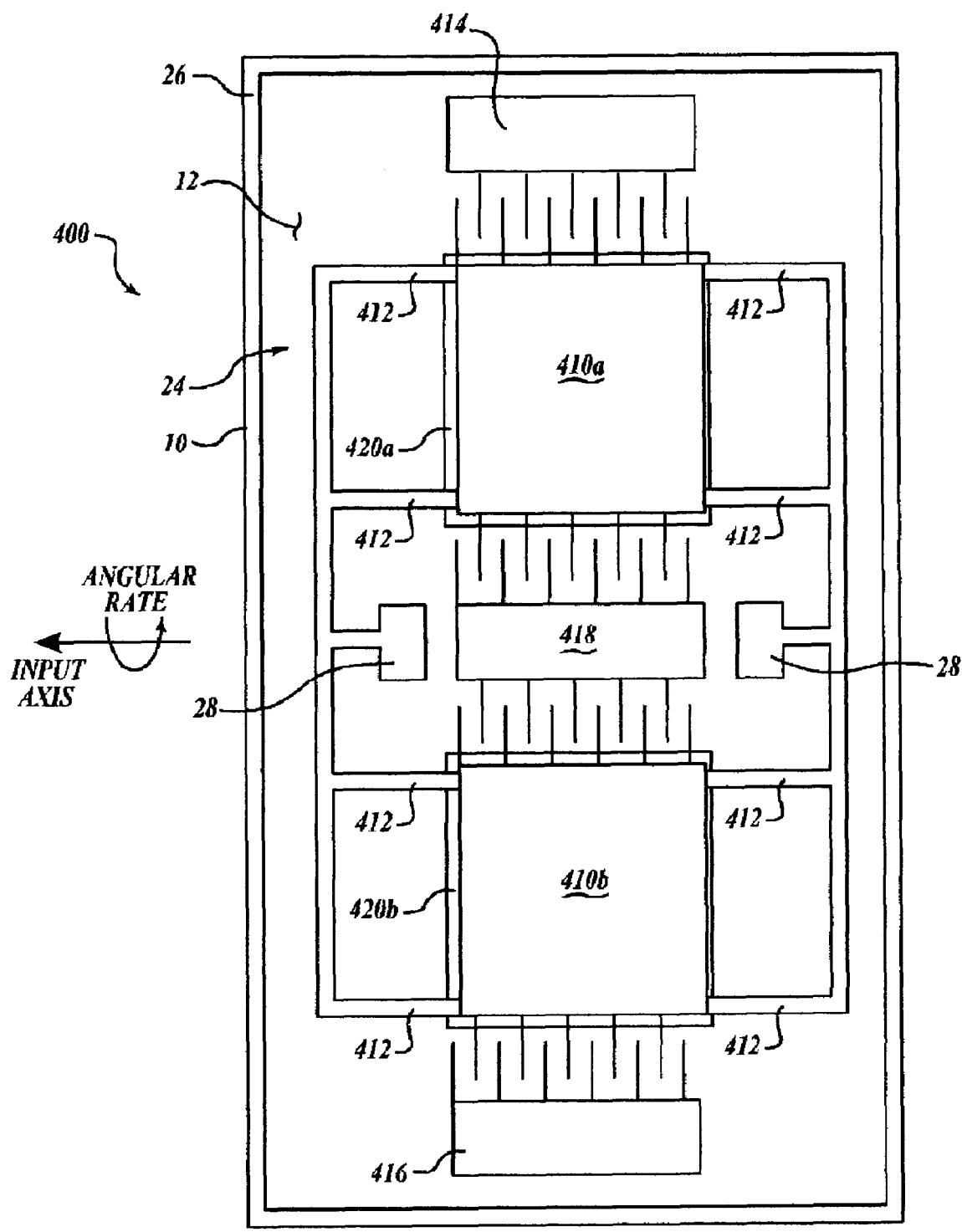
FIG. 20 is a plan view of the MEMS device of the invention embodied by example and without limitation as a simple MEMS Coriolis rate gyroscope or "gyro" device.

FIG. 20 is a plan view of the MEMS device 1 of the invention embodied by example and without limitation as a simple MEMS Coriolis rate gyroscope or "gyro" device 400 formed of a pair of electrostatic comb drive accelerometer devices suspended for both in-plane and out-of-plane motion. According to one embodiment of the invention, the mechanical features 24 of the simple MEMS Coriolis rate gyro device 400 includes two symmetrically arranged translational proof masses 410a, 410b arranged in a single device sensor mechanism 10 sandwiched between a single first or bottom cover plate 12 and a single second or top cover plate 14. The top cover plate 14 is omitted for clarity. The simple example is intended to explain the invention without limiting the claimed invention. The proof masses 410a, 410b are suspended by flexures 412 for both in-plane and out-of-plane motion. The cooperating interior cover plate features 31, 41 formed in the active layers 22b, 22c of the cover plates 12, 14 include fixed electrostatic motor comb drives 414, 416 and fixed electrostatic motor comb pickoff 418. A pair of mechanism anchors 28 are arranged between the proof masses 410a, 410b for supporting the proof masses 410a, 410b relative to the cover plates 12, 14 and for carrying input and output signals. The mechanism anchors 28 are fixed to one or both cover plates 12, 14 at respective cover plate anchors 30, 42, as described herein.

The cover plates 12, 14 joined to the bottom and top of the mechanism layer 10 each have two pickoff regions 420a, 420b, a respective one opposite each of the proof masses 410a, 410b. Each pair of regions 420a, 420b on a diagonal in opposite covers 12, 14 are electrically coupled. An output signal of the simple MEMS Coriolis rate gyro device 400 is proportional to difference between these two capacitive pairs. This output signal is demodulated to indicate angular rate.

Briefly, the motor section keeps two proof masses vibrating in an in-plane translational motion in opposition at a high resonant frequency on the order of about 20 kHz. For in-plane translation, i.e. without rotation about the input axis, the proof masses 410a, 410b do not experience out-of-plane motion so that the differential capacitance, i.e. the difference between the two capacitive pairs, remains zero. When the MEMS Coriolis rate gyro device 400 experiences a rotation rate, an out-of-plane Coriolis acceleration is induced in the device 400, that drives the two proof masses 410a, 410b out-of-phase so that a rocking motion is induced about the rotational input axis at the motor frequency. An alternating differential capacitance produced by this rocking motion is directly proportional to the rotational rate. Coriolis-based rate gyros of the type described herein are optionally operated in either open-loop or closed-loop modes.

The cover plates 12, 14 of the exemplary MEMS Coriolis rate gyro device 400 include the respective cooperating interior cover plate features 31, 41 formed in the active layers 22b, 22c of the respective cover plate SOI wafer elements 16b, 16c. The interior cover plate features 31, 41 being configured and arranged to cooperate with the mechanical features 24 of the Coriolis rate gyro mechanism layer 10. Accordingly, the interior cover plate features 31, 41 of the respective cover plates 12, 14 include cover plate anchors 30, 42 structured and arranged as described herein to cooperate with the fixed motor drives 414, 416 and fixed motor pickoff 418, as well as the two pickoff regions 420a, 420b. The interior cover plate features 31, 41 also include cover plate anchors 30, 42 structured and arranged as described herein to cooperate with the mechanism anchors 28 for conducting electrical signals to and from the proof masses 410a, 410b.

Pit features 34, 46 are formed in the handle layers 20b, 20c of the first and second cover plates 12, 14 in alignment with the cover plate anchors 30, 42. Wire bond pads 54, 56 are deposited on the inside surfaces 36, 50 of the first and second cover plate anchors 30, 42 exposed at the bottom of the respective pit features 34, 46. Alternatively, additional insulator material 58 is provided on the inside wall surface 60 of the top cover plate pit features 46, and the electrically conductive trace 62 is deposited there over in electrical contact with the surfaces 50 of the second cover plate anchors 42 and having the electrically conductive trace portion 64 extending onto the exterior surface 20c' of the top cover plate handle layer 20c where the stud bump 66 is formed for bonding in a conventional flip chip assembly process, as described herein.

According to one embodiment of the invention, the device sensor mechanism 10 of the MEMS Coriolis rate gyro device 400 includes the continuous marginal frame or rim 26 exposed in the active layer 22a of the mechanism SOI wafer element 16a, as disclosed herein. The marginal frame 26 is provided along a peripheral edge of the device sensor mechanism 10 completely surrounding the Coriolis rate gyro mechanical features 24. The matching marginal frames 32, 44 are formed in the active layers 22b, 22c of the cover plates 12, 14 for hermetically sealing the device sensor mechanism 10. The isolator flange 29 is optionally provided along the peripheral edge surface of the mechanism active layer 22a external of the Coriolis rate gyro mechanical features 24. The isolator flange 29 is coupled to an external peripheral edge surface 26a of the marginal frame 26.

Figure 21:
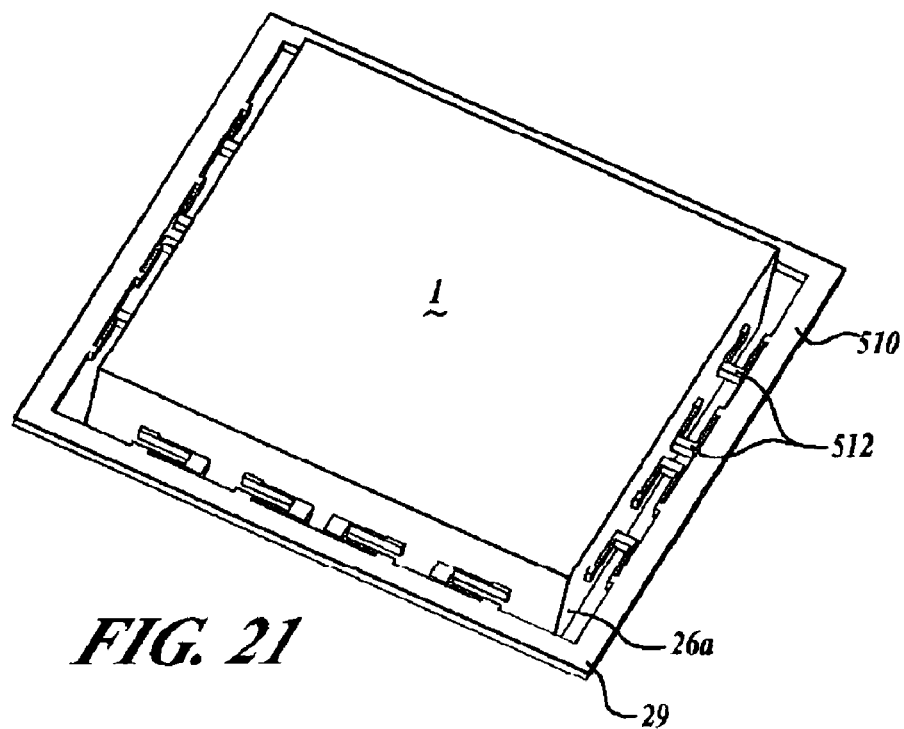
FIG. 21 is a perspective view of the MEMS device of the invention having an isolator flange of the invention provided along the peripheral edge surface of the mechanism active layer external of the mechanical features and extending from an external peripheral edge surface of the mechanism active layer.

FIG. 21 is a perspective view of the MEMS device 1 of the invention having the isolator flange 29 of the invention provided along the peripheral edge surface of the mechanism active layer 22a external of the mechanical features 24 and extending from the external peripheral edge surface 26a of the mechanism active layer 22a. The isolator flange 29 is either formed in the mechanism active layer 22a integrally with the marginal frame 26, or alternatively, the isolator flange 29 is formed separately from the mechanism active layer 22a in the active layer of a separate SOI wafer element and joined to the marginal frame 26 of the device sensor mechanism 10 at mid plane.

Figure 22:
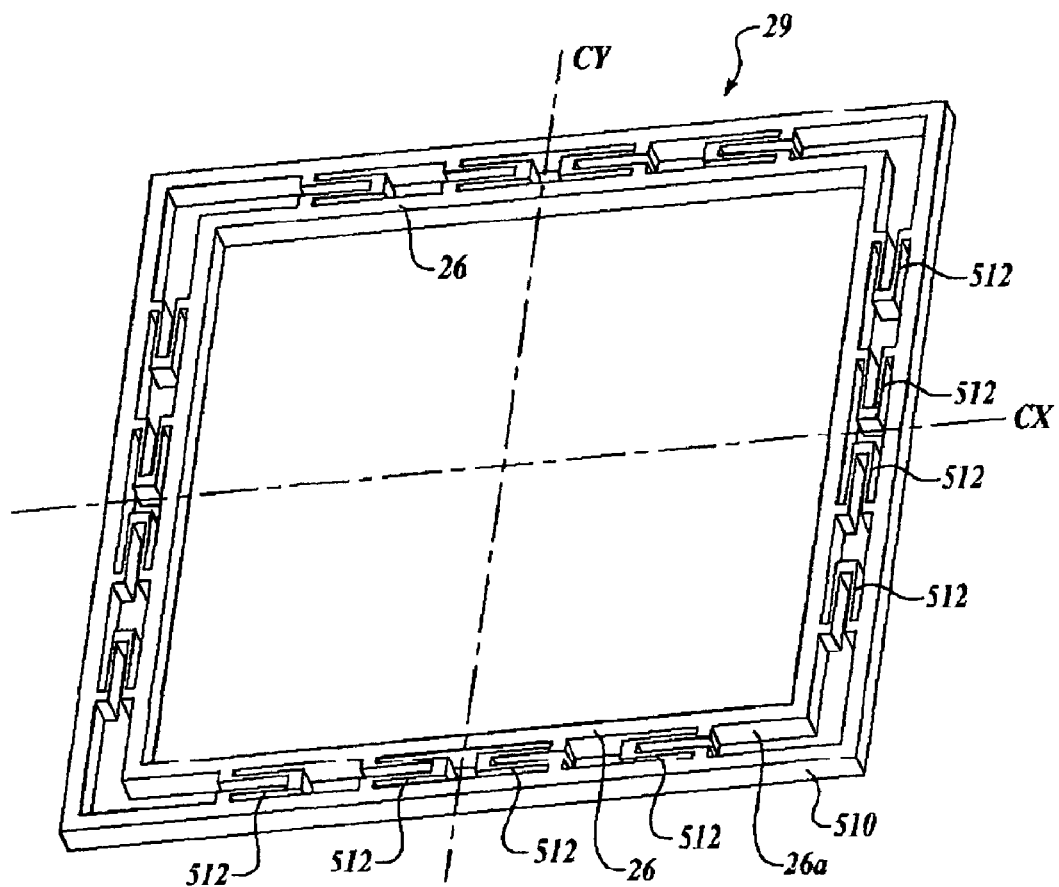
FIG. 22 is a perspective view of the isolator flange of the invention shown separately from the mechanical features and the remainder of the MEMS device.

FIG. 22 is a perspective view of the isolator flange 29 shown separately from the mechanical features 24 and the remainder of the MEMS device 1, including only the marginal frame 26 of the device sensor mechanism 10 for reference. The isolator flange 29 insulates the MEMS device 1 of the invention from outside forces that may present an error source. In an IPA or OPA of the types described herein, for example, radial stress applied to the die stack 100, 200 or 300 due to differential expansion between the silicon of the die stack components and the material of the chassis is a known source of accelerometer errors.

The isolator flange 29 includes a continuous outer marginal frame or rim 510 for attachment at next level assembly to a chassis, such as an LCC or a circuit board, to measure an input to the chassis, such as acceleration. The outer marginal frame 510 of the isolator flange 29 is coupled to the device mechanism marginal frame 26 by a quantity of flexures 512 each having a pair of tines 514, 516 that are compliant to radial expansion in the plane of the device sensor mechanism 10 in the mechanism active layer 22a while stiff against both in-plane and out-of-plane translation and against rotation. This radial expansion compliance reduces the magnitude of forces entering the MEMS device 1 at the outer marginal frame 510, while the translation and rotation resistance ensure the MEMS device 1 experiences external inputs, such as acceleration inputs, applied to the chassis to which the outer marginal frame 510 is attached.

The tines 514, 516 of each flexure 512 are formed the full thickness of the mechanism active layer 22a, or optionally of the active layer of a SOI wafer element separate from the mechanism active layer 22a. Each of the tines 514, 516 is embodied by example and without limitation as relatively thin in cross-section while being elongated in the plane of the mechanism active layer 22a along an axis substantially parallel with the external peripheral edge surface 26a of the mechanism active layer 22a and the marginal frame 26 of the device sensor mechanism 10, if present. The tines 514, 516 are arranged in spaced-apart parallel and coextensive pairs with an inner tine 514 arranged nearer the external peripheral edge surface 26a of the mechanism active layer 22a and an outer tine 516 arranged nearer the outer marginal frame 510 of the isolator flange 29. The inner and outer tines 514, 516 are coupled at respective first ends 514a, 516a to the respective adjacent mechanism external peripheral edge surface 26a and the isolator flange outer marginal frame 510 by mechanical couplers 518, 520 that are short and stiff relative to the tines 514, 516. The mechanical couplers 518, 520 are sufficiently long to space the tines 514, 516 for radial motion in the plane of the mechanism active layer 22a relative to the respective adjacent mechanism external peripheral edge surface 26a and the isolator flange outer marginal frame 510. Another relatively short and stiff mechanical coupler 332 couples together the inner and outer tines 514, 516 at respective second ends 514b, 516b opposite from the mechanical couplers 518, 520. The relatively short and stiff mechanical coupler 332 is sufficiently long to space the tines 514, 516 for radial motion in the plane of the mechanism active layer 22a relative to one another.

One or more of the flexures 512 are optionally arranged in reverse or opposing orientations along each edge of the device sensor mechanism 10. For example, flexures 512 are arranged symmetrically, with flexures 512 on opposite sides of the device centerlines Cy and Cx facing in opposite directions. Other arrangements of the flexures 512 are also contemplated. The number and arrangement of flexures 512 along with the relative length L and cross-sectional thickness T of the tines 514, 516 and the thickness of the mechanical couplers 518, 520 and 332 are all determined as a function of the intended operational range, sensitivity and other performance parameters of the MEMS device 1, and the vibration and acceleration operational environments as well as other operational environmental considerations.

According to one embodiment of the invention, the entirety of the isolator flange 29, including the outer marginal frame 510 and the flexures 512, is integrally formed in the mechanism active layer 22a with the mechanism marginal frame 26, the device mechanical features 24, and the remainder of the device sensor mechanism 10.

Figure 23:
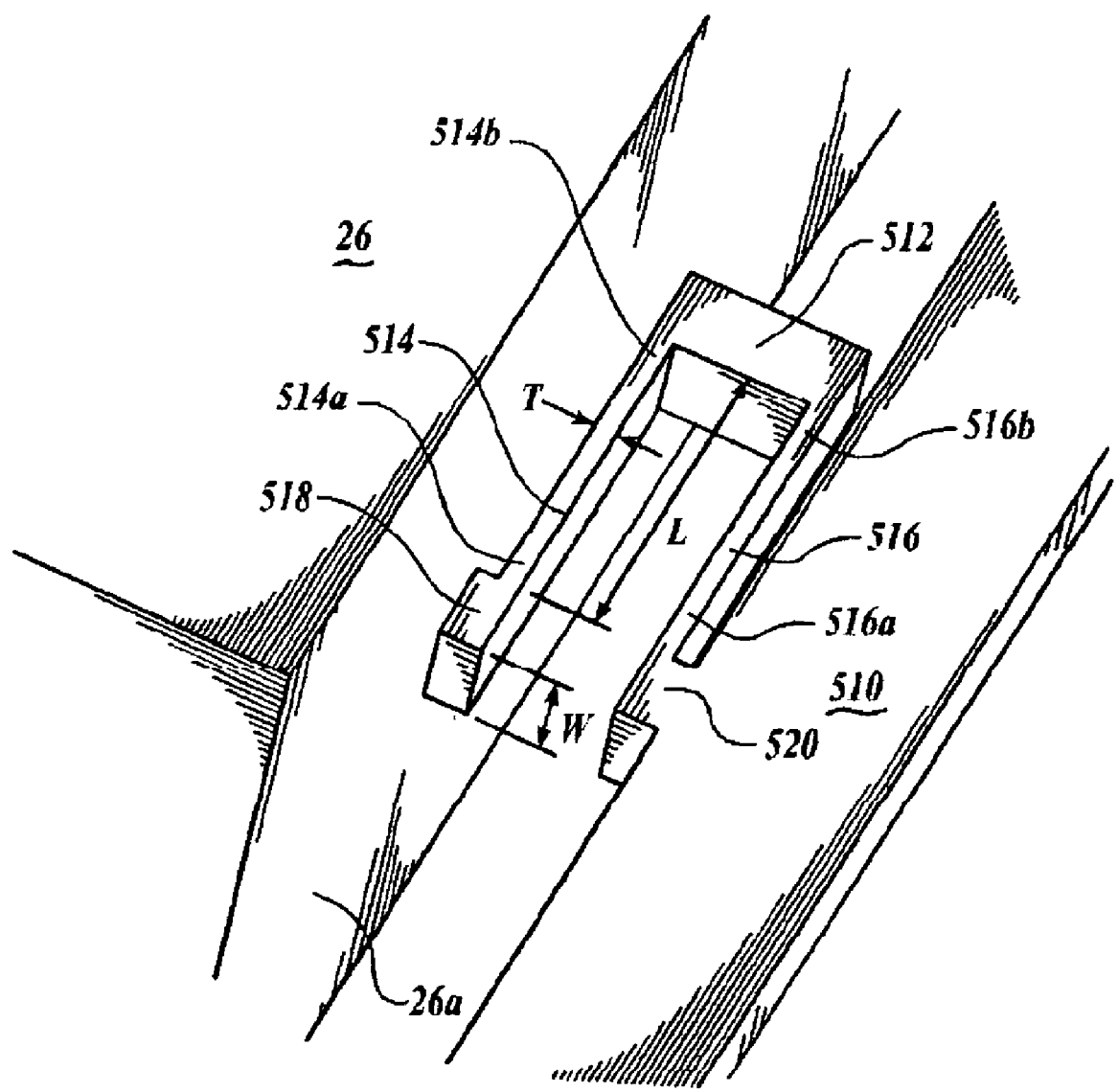
FIG. 23 is an enlarged perspective view of one flexure of the isolator flange of the invention showing the relatively elongated tines extending parallel with the mechanism external peripheral edge surface and the outer marginal frame.

FIG. 23 is an enlarged perspective view of one flexure 512 showing the tines 514, 516 being embodied as having length L that is relatively elongated and extended substantially parallel with the mechanism external peripheral edge surface 26a and the outer marginal frame 510, and a width W that is consistent with the finished thickness of the mechanism active layer 22a. As discussed herein, the tines 514, 516 have a cross-sectional thickness T that is selected as a function of the tine length L as well as other performance parameters and operational environmental considerations. As is also discussed herein, the mechanical couplers 518, 520 and 332 are all short and stiff relative to the tines 514, 516.

While the preferred embodiment of the invention has been illustrated and described, it will be appreciated that various changes can be made therein without departing from the spirit and scope of the invention.

What is claimed is:

1. A microelectromechanical system (MEMS) inertial device, comprising:
  a mechanism formed in an active layer of silicon semiconductor material, the mechanism being structured with one or more sensor mechanical features structurally supported by at least one mechanism anchor;
  a first cover plate formed of a Silicon-On-Oxide wafer having a semiconductor active layer separated from a semiconductor handle layer by a dielectric layer, the first cover plate active layer being structured with one or more interior cover plate features structured to cooperate with the sensor mechanical features and a cover plate anchor structured to cooperate with the mechanism anchor, the first cover plate handle layer being structured with a pit feature extending there through in alignment with the cover plate anchor, and the first cover plate dielectric layer being structured with an unbroken rim of material arranged to hermetically seal the cover late anchor to the first cover plate handle layer adjacent the pit feature while exposing a surface of the cover plate anchor to the pit feature, the cover plate anchor having a perimeter edge substantially aligned with a perimeter edge of the unbroken rim of the first cover plate dielectric layer;
  wherein the cover plate pit feature is further structured having an inverse pyramid shape;
  a frame formed in the mechanism active layer surrounding the one or more sensor mechanical features and the mechanism anchor and being bonded to a complementary frame formed in the first cover plate active layer; and
  a second cover plate formed of a Silicon-On-Oxide wafer having a semiconductor active layer separated from a semiconductor handle layer by a dielectric layer, the second cover plate active layer being structured with one or more interior cover plate features structured to cooperate with the sensor mechanical features and a frame complementary to the frame formed in the mechanism active layer and being bonded thereto opposite from the first cover plate,
  wherein the second cover plate is structured substantially the same as the first cover plate, including the second cover plate active layer being structured with one or more interior cover plate features structured to cooperate with the sensor mechanical features and a cover plate anchor structured to cooperate with the mechanism anchor, the second cover plate handle layer being structured with a pit feature extending there through in alignment with the cover plate anchor, and the second cover plate dielectric layer being structured with an unbroken rim of material arranged to hermetically seal the cover plate anchor to the semiconductor handle layer adjacent the pit feature while exposing a surface of the cover plate anchor to the pit feature; and
  a bond formed between the mechanism anchor and the cover plate anchor.

2. The inertial device of claim 1, further comprising an electrically conductive connector formed in the first cover plate active layer between the cover plate anchor and one of the interior cover plate features, and a second cover plate anchor formed in the first cover plate active layer.

3. The inertial device of claim 1, further comprising a radially compliant isolator flange coupled to the frame surrounding the sensor mechanical features and the mechanism anchor.

4. The inertial device of claim 1 wherein the one or more sensor mechanical features of the mechanism and the one or more interior cover plate features formed in each of the first and second cover plate active layers are structured to form an electrostatic accelerometer.

5. The inertial device of claim 1 wherein the one or more sensor mechanical features of the mechanism and the one or more interior cover plate features formed in each of the first and second cover plate active layers are structured to form a Coriolis rate gyroscope.

6. A micro electromechanical system (MEMS) inertial device, comprising:
  a sensor mechanism formed in an active layer of a Silicon-On-Oxide mechanism wafer, the sensor mechanism being structured with one or more sensor mechanical features structurally supported by one or more mechanism anchors positioned in a first pattern relative to the sensor mechanical features;

first and second cover plates formed of respective first and second Silicon-On-Oxide cover plate wafers each having a semiconductor active layer separated from a semiconductor handle layer by a relatively thin dielectric layer wherein:

the active layer of at least one of the first and second cover plates is structured with one or more interior cover plate features that are structured to cooperate with the sensor mechanical features, and is further structured with one or more cover plate anchors positioned in a second pattern that is structured to cooperate with the pattern of mechanism anchors, the handle layer of the cover plate that is structured with the one or more interior cover plate features and the cover plate anchors is further structured with a pit feature in alignment with one or more of the cover plate anchors that extends through the handle layer from the cover plate anchor to an exterior surface of the handle layer, a portion of each dielectric layer is arranged as a continuous marginal rim adjacent the pit feature to hermetically seal the cover plate anchor to the handle layer adjacent the pit feature while exposing a surface of the cover plate anchor to the pit feature, the cover plate anchor includes a perimeter edge substantially aligned a perimeter edge of the continuous marginal rim, wherein both the first and second cover plates are structured with the one or more cover plate anchors positioned in a second pattern that is structured to cooperate with the pattern of mechanism anchors, the handle layer of both the first and second cover plates is structured with the pit feature in alignment with one or more of the cover plate anchors, and the dielectric layer includes the continuous marginal rim; and a radially compliant isolator flange coupled to the continuous marginal frame surrounding the sensor mechanical features and mechanism anchors.

7. The inertial device of claim 6, wherein the active layer the Silicon-On-Oxide mechanism wafer further comprises a continuous marginal frame completely surrounding the sensor mechanical features and mechanism anchors, and the active layer both the first and second cover plates further comprises a complementary continuous marginal frame bonded to respective first and second surfaces of the mechanism continuous marginal frame.

8. The inertial device of claim 6 wherein the one or more sensor mechanical features of the sensor mechanism and the one or more interior cover plate features formed in each of the first and second cover plate active layers are structured to form an electrostatic accelerometer.

9. The inertial device of claim 6 wherein the one or more sensor mechanical features of the sensor mechanism and the one or more interior cover plate features formed in each of the first and second cover plate active layers are structured to form a Coriolis rate gyroscope.

10. A microelectromechanical system (MEMS) inertial device comprising:

one or more sensor mechanical features structurally supported by one or more mechanism anchors, the sensor mechanical features and mechanism anchors being formed in a semiconductor material active layer of a first Silicon-On-Oxide wafer having a dielectric material layer between a semiconductor material handle layer and the semiconductor material active layer;

one or more interior cover plate features structured to cooperate with the sensor mechanical features to form an inertial device, the interior cover plate features being formed in a semiconductor material active layer of a second Silicon-On-Oxide wafer having a dielectric material layer between a semiconductor material handle layer and the semiconductor material active layer;

one or more cover plate anchors structured to cooperate with the mechanism anchors, the cover plate anchors being formed in the semiconductor material active layer of the second Silicon-On-Oxide wafer;

a pit feature extending through the semiconductor material handle layer of the second Silicon-On-Oxide wafer in alignment with one of the cover plate anchors;

a window formed through the dielectric material layer of the second Silicon-On-Oxide wafer, the window forming an unbroken rim of dielectric material between the cover plate anchor and the pit feature in alignment therewith;

a surface of the cover plate anchor proximate to and in alignment with the cover plate pit feature being exposed through the window formed through the dielectric material layer of the second Silicon-On-Oxide wafer;

a first surface of the mechanism anchors coupled to a surface of the cooperating cover plate anchors opposite from the cover plate dielectric and handle layers with the interior cover plate features positioned relative to the sensor mechanical features for cooperating therewith, wherein the semiconductor material handle layer and dielectric material layer of the first Silicon-On-Oxide wafer are removed;

a radially compliant isolator coupled to an external surface of a substantially continuous marginal frame, which is formed in the semiconductor material active layer of the first Silicon-On-Oxide wafer, the continuous marginal frame arranged to substantially surround the sensor mechanical features and one or more of the mechanism anchors;

a third Silicon-On-Oxide wafer having a dielectric material layer between a semiconductor material handle layer and the semiconductor material active layer;

one or more interior cover plate features formed in the semiconductor material active layer of the third Silicon-On-Oxide wafer, the interior cover plate features being structured to cooperate with the sensor mechanical features to form an inertial device;

one or more cover plate anchors formed in the semiconductor material active layer of the third Silicon-On-Oxide wafer, the cover plate anchors being structured to cooperate with the mechanism anchors;

a pit feature extending through the semiconductor material handle layer of the third Silicon-On-Oxide wafer in alignment with one of the cover plate anchors;

a window formed through the dielectric material layer of the third Silicon-On-Oxide wafer, the window forming an unbroken rim of dielectric material between the cover plate anchor and the pit feature in alignment therewith; and a surface of the cover plate anchor proximate to and in alignment with the cover plate pit feature being exposed through the window formed through the dielectric material layer of the third Silicon-On-Oxide wafer.

11. The device of claim 10, further comprising:

in the respective semiconductor material active layer of the second and third Silicon-On-Oxide wafers, a substantially continuous marginal frame being formed corresponding to the marginal frame formed in the semiconductor material active layer of the first Silicon-On-Oxide wafer;

a first surface of the marginal frame formed in the active layer of the first Silicon-On-Oxide wafer being coupled to a surface of the corresponding marginal frame formed in the active layer of the second Silicon-On-Oxide wafer; and a second surface of the marginal frame formed in the active layer of the first Silicon-On-Oxide wafer opposite from the first surface thereof being coupled to a surface of the corresponding marginal frame formed in the active layer of the third Silicon-On-Oxide wafer.

12. The device of claim 10, wherein the inertial device further comprises an accelerometer.

* * * * *